United States Patent
Slimani

(10) Patent No.: US 12,172,931 B2
(45) Date of Patent: *Dec. 24, 2024

(54) METHOD FOR MAKING SUPERCONDUCTING COIL FOR MAGNETIC RESONANCE IMAGING

(71) Applicant: Imam Abdulrahman Bin Faisal University, Dammam (SA)

(72) Inventor: Yassine Slimani, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/520,624

(22) Filed: Nov. 28, 2023

(65) Prior Publication Data

US 2024/0092698 A1    Mar. 21, 2024

Related U.S. Application Data

(63) Continuation of application No. 18/363,817, filed on Aug. 2, 2023, now Pat. No. 11,858,853, which is a (Continued)

(51) Int. Cl.
*C04B 35/45* (2006.01)
*C04B 35/626* (2006.01)
(Continued)

(52) U.S. Cl.
CPC .... *C04B 35/4504* (2013.01); *C04B 35/62615* (2013.01); *C04B 35/6262* (2013.01); *C30B 29/225* (2013.01); *H10N 60/857* (2023.02)

(58) Field of Classification Search
CPC .......... C04B 35/4504; C04B 35/62615; C30B 29/225; H10N 60/857
See application file for complete search history.

(56) References Cited

U.S. PATENT DOCUMENTS

| 5,223,478 A | 6/1993 | Whitlow |
| 5,413,980 A | 5/1995 | Maier et al. |

(Continued)

FOREIGN PATENT DOCUMENTS

| CN | 1168813 A | 12/1997 |
| CN | 102534787 B | 8/2015 |
| CN | 106876041 A | 6/2017 |

OTHER PUBLICATIONS

Akduran "Superconducting Fluctuations in Polycrystalline $Y_3Ba_5Cu_8O_{1B}$", J Low Temp Phys, 168: 323-333 (Year: 2012).

(Continued)

*Primary Examiner* — Paul A Wartalowicz
(74) *Attorney, Agent, or Firm* — Oblon, McClelland, Maier & Neustadt, L.L.P.

(57) ABSTRACT

A method of producing polycrystalline $Y_3Ba_5Cu_8O_y$ (Y-358) whereby powders of yttrium (III) oxide, a barium (II) salt, and copper (II) oxide are pelletized, calcined at 850 to 950° C. for 8 to 16 hours, ball milled under controlled conditions, pelletized again and sintered in an oxygen atmosphere at 900 to 1000° C. for up to 72 hours. The polycrystalline $Y_3Ba_5Cu_8O_y$ thus produced is in the form of elongated crystals having an average length of 2 to 10 μm and an average width of 1 to 2 μm, and embedded with spherical nanoparticles of yttrium deficient $Y_3Ba_5Cu_8O_y$ having an average diameter of 5 to 20 nm. The spherical nanoparticles are present as agglomerates having flower-like morphology with an average particles size of 30 to 60 nm. The ball milled polycrystalline $Y_3Ba_5Cu_8O_y$ prepared under controlled conditions shows significant enhancement of superconducting and flux pinning properties.

10 Claims, 17 Drawing Sheets

Related U.S. Application Data continuation of application No. 18/115,112, filed on Feb. 28, 2023, now Pat. No. 11,767,267, which is a continuation of application No. 17/352,995, filed on Jun. 21, 2021, now Pat. No. 11,613,501, which is a continuation of application No. 16/139,755, filed on Sep. 24, 2018, now Pat. No. 11,130,712.

(51) Int. Cl.
 *C30B 29/22* (2006.01)
 *H10N 60/85* (2023.01)

(56) References Cited

U.S. PATENT DOCUMENTS

| | | |
|---|---|---|
| 5,866,515 A | 2/1999 | Dorris |
| 11,130,712 B2 | 9/2021 | Slimani |
| 11,613,501 B2 | 3/2023 | Slimani |
| 2011/0179809 A1* | 7/2011 | Zhang .............. H01F 6/04 62/51.1 |
| 2012/0115731 A1 | 5/2012 | Salavati-Niasari et al. |

OTHER PUBLICATIONS

Kutuk et al. "An investigation of magnetoresistivity properties of an $Y_3Ba_5Cu_8O_y$ bulk superconductor." Journal of alloys and compounds, 650: 159-164. (Year: 2015).

Thitipong Kruaehong, et al., "Synthesized and characterization of $YBa_2Cu_3O_y$, $Y_3Ba_5Cu_8O_y$, and $Y_7Ba_{11}Cu_{18}O_y$ Superconductors by planetary high-energy ball-milling", Journal of Australian Ceramic Society, vol. 53, Issue 1, Apr. 2017, pp. 3-10.

K S Martirosyan, et al., "The fabrication of YBCO superconductor polycrystalline powder by CCSO", Superconductor Science and Technology, vol. 21, No. 6, Mar. 19, 2008, pp. 1-3.

Abdul Hai Alami, et al., "Facile and Cost-Effective Synthesis and Deposition of a YBCO Superconductor on Copper Substrates by High-Energy Ball Milling", Metallurgical and Materials Transactions A, vol. 47, Issue 12, Dec. 2016, pp. 6160-6168.

A. Hamrita, et al., "Superconducting properties of polycrystalline $YBa_2Cu_3O_{7-d}$ prepared by sintering of ball-milled precursor powder", vol. 40, 2014, pp. 1461-1470.

\* cited by examiner

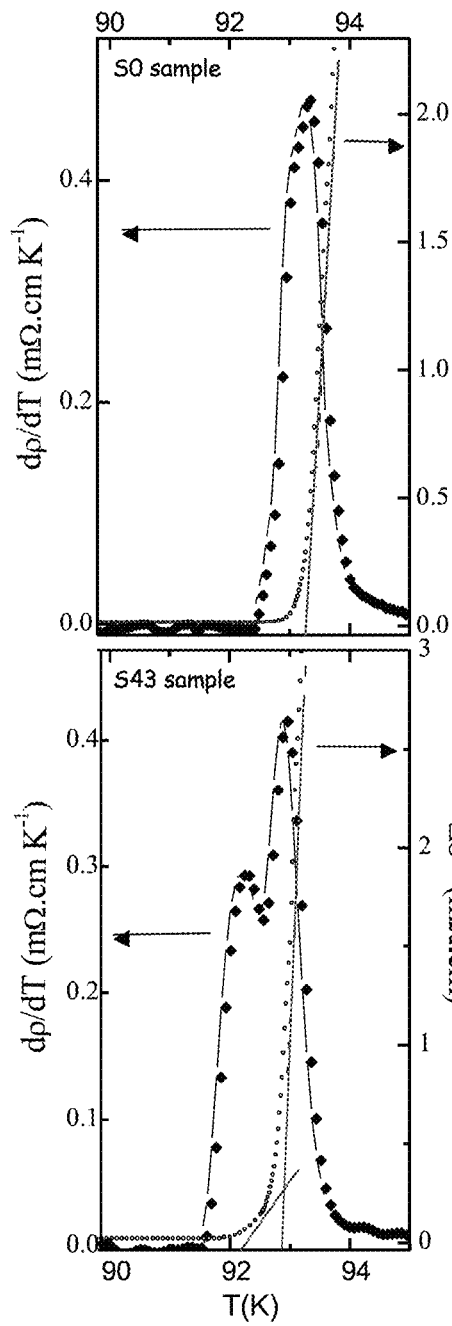
FIG. 6A
FIG. 6C
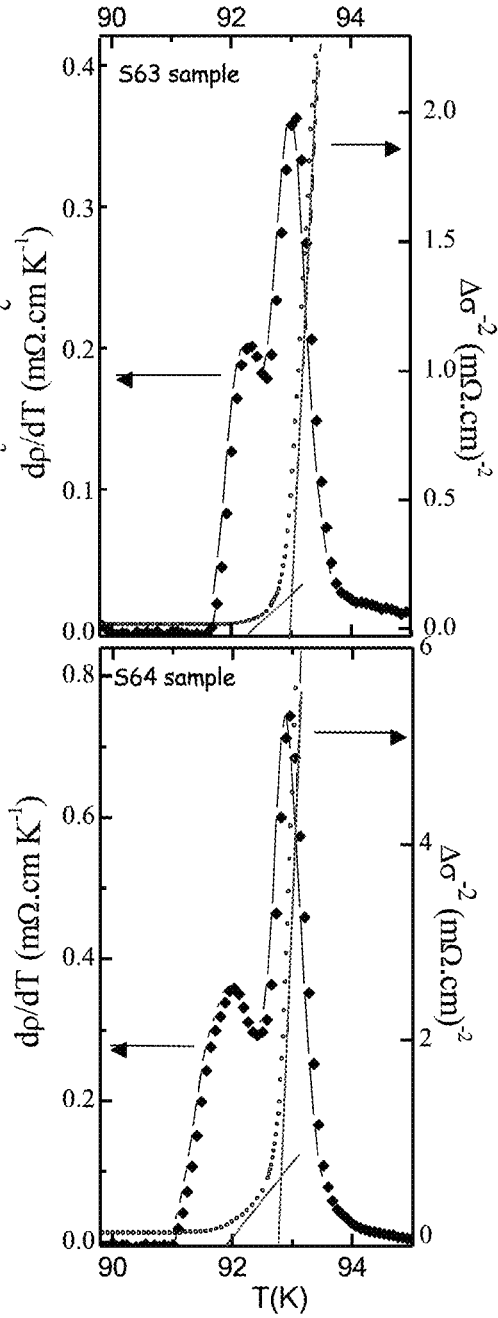
FIG. 6B
FIG. 6D

METHOD FOR MAKING SUPERCONDUCTING COIL FOR MAGNETIC RESONANCE IMAGING

CROSS-REFERENCE TO RELATED APPLICATIONS

The present application is a Continuation of U.S. application Ser. No. 18/363,817, now allowed, having a filing date of Aug. 2, 2023 which is a Continuation of U.S. application Ser. No. 18/115,112, now U.S. Pat. No. 11,767,267, having a filing date of Feb. 28, 2023 which is a Continuation of U.S. application Ser. No. 17/352,995, now U.S. Pat. No. 11,613,501, which is a Continuation of U.S. application Ser. No. 16/139,755, now U.S. Pat. No. 11,130,712 having a filing date of Sep. 24, 2018.

BACKGROUND OF THE DISCLOSURE

Technical Field

The present disclosure relates to a method of producing a polycrystalline yttrium barium copper oxide (YBCO) material, specifically $Y_3Ba_5Cu_8O_y$ (Y-358), using ball milling.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Yttrium barium copper oxide (YBCO) compounds are among the class of high-Tc superconductors (HTS) that have been the subject of many research studies. The most recognized YBCO superconductor is $YBa_2Cu_3O_y$ ("Y-123"). This material exhibits unique characteristics that make it a promising candidate for electronic and magnetic applications, i.e., electric motors and power transmission, particle accelerators, magnetic levitators devices, and transfer cable generators, etc. After the discovery of the superconductivity phenomena in Y-123, researchers have searched for novel phases of YBCO materials that exhibit higher superconducting transition temperature ($T_{co}$) and greater superconducting properties than Y-123. Recently, a new yttrium-based superconductor with different characteristics and structural properties, $Y_3Ba_5Cu_8O_{18\pm\delta}$ ("Y-358"), has been investigated [A. Aliabadi, Y. Akhavan Farshchi, M. Akhavan, Physica C 469 (2009) 2012-2014.]. This material has five $CuO_2$ planes and three CuO chains (which exceed those in Y-123), and superconducting transition temperatures $T_{co}$ in the range between 78 and 98 K. However, for use in practical applications, new methods are needed for producing Y-358 with increased critical current density $J_c$ when subject to a magnetic field by improving flux pinning.

The introduction of secondary phases inside the superconducting matrix is one way to improve flux pinning properties [E. Hannachi, Y. Slimani, F. Ben Azzouz, A. Ekicibil, Ceramics International (2018), https://doi.org/10.1016/j.ceramint.2018.07.118; R. A. Al-Mohsin, A. L. Al-Otaibi, M. A. Almessiere, H. Al-badairy, Y. Slimani, F. Ben Azzouz, Journal of Low Temperature Physics 192 (2018) 100-116; M. K. Ben Salem, E. Hannachi, Y. Slimani, A. Hamrita, M. Zouaoui, L. Bessais, M. Ben Salem, F. Ben Azzouz, Ceramics International 40 (2014) 4953-4962]. While doping has achieved an improvement in the superconducting properties of Y-358, the fabrication processes may introduce various intermediate phases in equilibrium and thus influence the microstructure evolution of the material. Recently, high energy ball milling (HEBM) has been used to alter the superconducting characteristics of $MgB_2$ compounds either in bulk form or as tapes and wires [M. Shahabuddin, N. S. Alzayed, M. P. Jafar, M. Asif, Physica C 471 (2011) 1635; Z. Ma, Y. C. Liu, J. Huo, Supercond. Sci. Technol. 22 (2009) 125006; X. Xu, J. H. Kim, S. X. Dou, S. Choi, J. H. Lee, H. W. Park, M. Rindfleish, M. Tomsic, J. Appl. Phys. 105 (2009) 103913, as well as for the synthesis of FeSe superconductors with high superconducting phase content and improved superconducting properties [S. Zhang, J. Liu, J. Feng, Ch. Li, X. Ma, P. Zhang, J. Materiomics 1 (2015) 118. Recently, the influence of HEBM on the superconducting properties of Y-123 superconductors has been studied [A. Hamrita, Y. Slimani, M. K. Ben Salem, E. Hannachi, L. Bessais, F. Ben Azzouz, M. Ben Salem Ceramics International, 40 (2014) 1461-1470—incorporated herein by reference in its entirety].

In view of the forgoing, one object of the present disclosure is to provide methods for producing $Y_3Ba_5Cu_8O_y$ (Y-358) with a novel morphology/microstructure and thus improved superconducting properties.

BRIEF SUMMARY OF THE DISCLOSURE

Accordingly, it is one object of the present invention to provide novel methods of producing polycrystalline $Y_3Ba_5Cu_8O_y$ (Y-358) with a unique morphology and improved superconducting properties.

These and other objects, which will become apparent during the following detailed description, have been achieved by the inventors' discovery that ball milling under controlled conditions provides polycrystalline $Y_3Ba_5Cu_8O_y$ with a unique morphology of elongated crystals with spherical nanoparticles disposed on the elongated crystals, and the polycrystalline $Y_3Ba_5Cu_8O_y$ material formed has been found to possess superior superconducting properties.

Therefore, according to a first aspect, the present disclosure relates to a method of producing polycrystalline $Y_3Ba_5Cu_8O_y$, involving (i) pelletizing powders of yttrium (III) oxide, a barium (II) salt, and copper(II) oxide to produce a pelletized mixture, (ii) calcining the pelletized mixture at 850 to 950° C. to produce a calcined mixture, (iii) ball milling the calcined mixture to produce a ball milled sample, and (iv) sintering the ball milled sample at 900 to 1000° C. in an oxygen environment, where the final polycrystalline $Y_3Ba_5Cu_8O_y$ is in the form of elongated crystals having an average length of 2 to 10 μm and an average width of 1 to 2 μm embedded with spherical nanoparticles with an average diameter of 5 to 20 nm.

In some embodiments, the barium (II) salt is barium (II) carbonate $BaCO_3$.

In some embodiments, the pelletized mixture is calcined twice at 850° C. to 950° C. for 8 to 16 hours.

In some embodiments, the calcined mixture is ball milled using a planetary ball mill.

In some embodiments, the calcined mixture is ball milled using stainless steel balls and vials.

In some embodiments, the calcined mixture is ball milled with a ball to powder weight ratio of 1:1 to 5:2.

In some embodiments, the calcined mixture is ball milled at a rotational speed of 300 to 600 rpm.

In some embodiments, the calcined mixture is ball milled for 3 to 5 hours.

In some embodiments, the calcined mixture is ball milled non-continuously with a paused time of 5 to 10 minutes every 20 to 30 minutes in favor of cooling the system down and reverse rotation.

In some embodiments, the ball milled mixture is heat treated in an oxygen atmosphere at 900 to 1000° C. for up to 72 hours.

In some embodiments, the spherical nanoparticles generated by ball milling process are present as agglomerates having a flower-like morphology with an average particle size of 30 to 60 nm.

In some embodiments, the spherical nanoparticles generated by ball milling process are uniformly dispersed on the elongated crystals.

In some embodiments, the polycrystalline $Y_3Ba_5Cu_8O_y$ has a normalized transport critical current density, $J_{ctN}$ of 0.040 to 0.044 under an applied transverse magnetic field ($\mu_0 H$) of 100 mT.

In some embodiments, the optimized ball milled polycrystalline $Y_3Ba_5Cu_8O_y$ has a magnetization critical current density $J_{cm}$, of $12 \times 10^3$ to $15 \times 10^3$ A·cm$^{-2}$ and 550 to 570 A·cm$^{-2}$ at 0 Tesla and 1 Tesla, respectively.

In some embodiments, the polycrystalline $Y_3Ba_5Cu_8O_y$ has a lower critical magnetic field ($B_{c1}(0)$) of 7 to 7.25 Tesla and an upper critical magnetic field ($B_{c2}(0)$) of 580 to 585 Tesla.

In some embodiments, the polycrystalline $Y_3Ba_5Cu_8O_y$ has an estimated critical current density at temperature T=0K ($J_c(0)$)) of $320 \times 10^3$ to $330 \times 10^3$ A·cm$^{-2}$.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 6A is a plot of dp/dT versus temperature and $\Delta\sigma^{-2}$ versus T for S0 hand grinded sample.

FIG. 6B is a plot of dp/dT versus temperature and $\Delta\sigma^{-2}$ versus T for S1 ball milled sample.

FIG. 6C is a plot of dp/dT versus temperature and $\Delta\sigma^{-2}$ versus T for S2 ball milled sample.

FIG. 6D is a plot of dp/dT versus temperature and $\Delta\sigma^{-2}$ versus T for S3 ball milled sample.

DETAILED DESCRIPTION OF THE EMBODIMENTS

Figure 1:
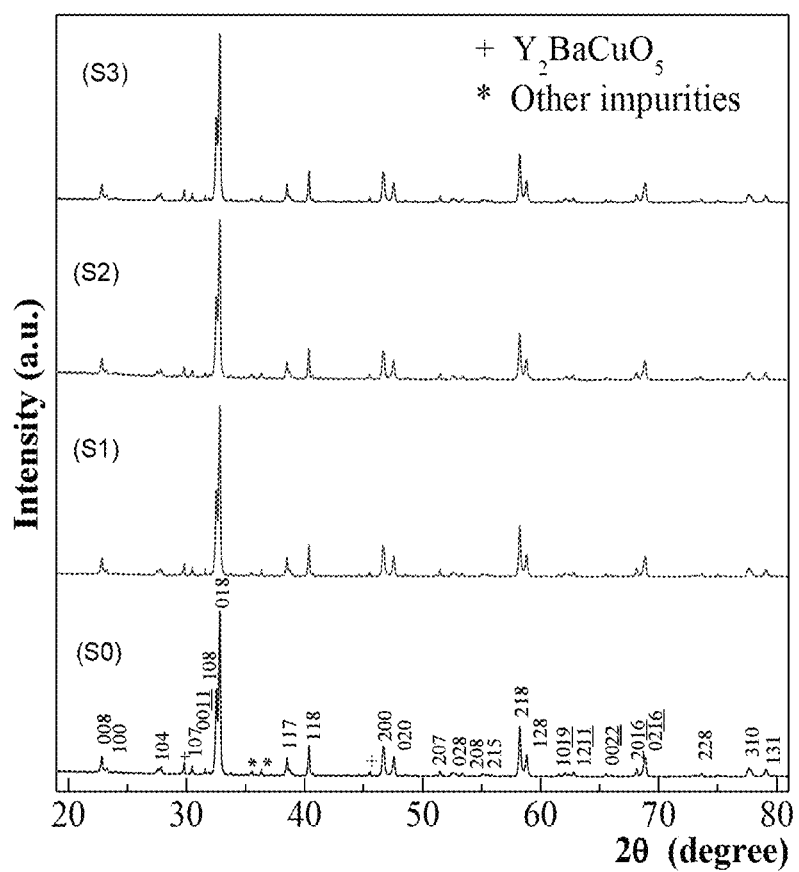
FIG. 1 is the X-ray powder diffraction patterns of the S0-hand grinded and S1, S2, S3 ball milled samples.

Embodiments of the present disclosure will now be described more fully hereinafter with reference to the accompanying drawings, in which some, but not all of the embodiments of the disclosure are shown.

As used herein, the words "a" and "an" and the like carry the meaning of "one or more". Additionally, within the description of this disclosure, where a numerical limit or range is stated, the endpoints are included unless stated otherwise. Also, all values and subranges within a numerical limit or range are specifically included as if explicitly written out.

As used herein, the terms "optional" or "optionally" means that the subsequently described event(s) can or cannot occur or the subsequently described component(s) may of may not be present (e.g. 0 wt. %).

The phrase "substantially free", unless otherwise specified, describes an amount of a particular component (e.g., a metal oxide), that when present, is present in an amount of less than about 1 wt. %, preferably less than about 0.5 wt. %, more preferably less than about 0.1 wt. %, even more preferably less than about 0.05 wt. %, relative to a total weight of the composition being discussed, and also includes situations where the composition is completely free of the particular component (i.e., 0% wt.).

The term "comprising" is considered an open-ended term synonymous with terms such as including, containing or having and is used herein to describe aspects of the invention which may include additional components, functionality and/or structure. Terms such as "consisting essentially of" are used to identify aspects of the invention which exclude particular components that are not explicitly recited in the claim but would otherwise have a material effect on the basic and novel properties of the polycrystalline $Y_3Ba_5Cu_8O_y$, or the methods for making said material. The term "consisting of" describes aspects of the invention in which only those features explicitly recited in the claims are included and thus other components not explicitly or inherently included in the claim are excluded.

A weight percent of a component, unless specifically stated to the contrary, is based on the total weight of the formulation or composition in which the component is included. For example if a particular element or component in a composition is said to have 8 wt. %, it is understood that this percentage is in relation to a total compositional percentage of 100%.

The terms "milled" vs. "unmilled" are used herein to differentiate products produced using the inventive ball mill-based methods ("milled") vs. those produced by non-ball mill-based methods (i.e., hand milling/hand grinding with a mortar and pestle).

Methods

Besides the different molecular formula and thus atomic percentages of Y, Ba and Cu, polycrystalline $Y_3Ba_5Cu_8O_y$, ("Y-358") differs from other YBCO family members such as $YBa_2Cu_3O_d$ ("Y-123") in that it possesses five $CuO_2$ planes and three CuO chains, and has distinct characteristics and properties. In the nominal chemical formula of $Y_2Ba_5Cu_8O_y$, y is the oxygen content that v in most cases between 17 and 19, most preferably 18. Y-358 refers to a polycrystalline material composed of oxides of yttrium, barium, and copper in a 3:5:8 molar ratio, where the purity of oxides of yttrium, barium, and copper is greater than 99 wt. %, preferably greater than 99.5 wt. %, preferably greater than 99.9 wt. %, most preferably 99.99 wt. %. In preferred embodiments, no metals are present (which can be in the form of elemental metals, metal oxides, or metal salts) other than yttrium, barium, and copper. For example, the polycrystalline Y-358 is preferably substantially free of or completely free of elements, oxides and/or salts of bismuth, tungsten, promethium, silver, and the like. In some embodiments, only the polycrystalline Y-358 superconducting material is present, and the Y-358 is not composited or coated with other non-metal materials such as graphene to make the superconducting material. Furthermore, when referencing the Y-358 product produced by the methods described herein, it is to be assumed that the produced polycrystalline material contains at least 80%, preferably at least 85%, preferably at least 90%, preferably at least 95% of the Y-358 phase as determined by X-ray diffraction, and is free of or is substantially free of other polycrystalline phases, e.g., $YBa_2Cu_3O_y$(Y-123), $Y_2BaCuO_y$(Y-211), $Y_7Ba_{11}Cu_{18}O_y$(Y-7-11-18), $YBa_2Cu_4O_y$, (Y-124), $Y_2Ba_4Cu_7O_y$, (Y-247), and the like, unless specifically stated otherwise.

Perhaps due to the fundamental chemical differences between Y-358 and other YBCO family members (e.g., Y-123), it disclosed herein that the techniques and process parameters effective for producing Y-358 with advantageous superconducting properties differ from techniques and process parameters suitable for forming Y-123 [see A. Hamrita, Y. Slimani, M. K. Ben Salem, E. Hannachi, L. Bessais, F. Ben Azzouz, M. Ben Salem, Ceramics International, 40 (2014) 1461-1470—incorporated herein by reference in its entirety]. The inventive method for producing polycrystalline Y-358 are disclosed below.

Starting Material Mixture

Yttrium (III) oxide, a barium (II) salt, and copper(II) oxide are preferably used as starting materials. The barium (II) salt may be a barium oxocarbon anion or carboxylate e.g., barium carbonate ($BaCO_3$), barium cyclohexanebutyrate, barium 2-ethylhexanoate, barium octoate; a barium alkoxide e.g., barium methoxide, barium ethoxide, barium isopropoxide; a barium halide e.g., barium bromide, barium chloride, barium fluoride, barium iodide; barium chromate; barium hydroxide; barium phosphate; barium metaphosphate; and the like, including mixtures thereof. In preferred embodiments, the barium (II) salt is barium carbonate ($BaCO_3$).

It is preferred that powders of the yttrium (III) oxide ($Y_2O_3$), barium (II) carbonate ($BaCO_3$), and copper (II) oxide (CuO) are used, and that the powders are mixed in an atomic percentage to provide a nominal composition of Y:3/Ba:5/Cu:8. While it is possible to introduce other materials, compounds, additives, etc. at this stage, the mixed powder preferably consists of or consists essentially of only the yttrium, barium, and copper starting materials (i.e., respective oxides and/or salts thereof), and thus it is preferred that no other materials, compounds, additives, etc. are present which would materially affect the ability of the mixture to be pelletized, mechanically alloyed, and sintered as discussed hereinafter to form the polycrystalline Y-358. For example, the mixed powder is preferably free of potassium carbonate. Furthermore, while not always the case, it is preferred that only a single source of each of yttrium, barium, and copper is employed in the methods herein, i.e., the only source of yttrium used to make the polycrystalline Y-358 is yttrium (III) oxide, the only source of copper used to make the polycrystalline Y-358 is copper (II) oxide, and there is only one source of barium (i.e., one barium (II) salt e.g., $BaCO_3$) used to make the polycrystalline Y-358. Other sources of yttrium (e.g., yttrium carbonate, yttrium chloride, yttrium nitrate, yttrium trifluoroacetate, yttrium acetate, yttrium acetoacetonate, etc.), other sources of copper (copper carbonate, copper chloride, copper nitrate, copper trifluoroacetate, copper acetate, copper acetoacetonate, copper bromide, copper hydroxide, etc.), and other sources of barium (e.g., barium oxide), are preferably not employed as starting materials in the disclosed inventive methods.

The powders of yttrium (III) oxide ($Y_2O_3$), barium (II) salt carbonate (e.g. $BaCO_3$), and copper (II) oxide (CuO) are mixed in accordance to the chemical formula Y:3/Ba:5/Cu:8 using an agate mortar and pestle.

Pressing/Pelletizing

After mixing, the mixed powders may be advantageously shaped by processes such as uniaxial pressing, isostatic pressing, molding, compacting, extrusion, injection, or any other pelletizing technique known to those of ordinary skill in the art, to produce a pelletized mixture. Preferably, the mixed powders are uniaxially pressed/pelletized, meaning the compaction of powder into a rigid mold by applying pressure in a single axial direction through a rigid die or piston. The mixed powder may be pelletized using hot uniaxial pressing (i.e., uniaxial pressing under the application of heat), for example under a temperature of 800 to 1,500° C. as described in US8168092B2. In most preferred embodiments, the mixed powders are uniaxially cold pressed, preferably at a temperature of less than 40° C., preferably less than 35° C., preferably 20 to 30° C. The mixed powders may be pelletized under a wide range of applied pressures, for example 5 to 700 MPa, preferably 10 to 600 MPa, preferably 20 to 300 MPa, preferably 30 to 100 MPa, preferably 40 to 60 MPa. The shape of the produced pellets is not particularly limiting, and can be adjusted by appropriate selection of the mold, die, and/or piston employed during the pelletizing processes, so long as a uniform density is achieved in the pelletized mixture. A uniform density is desirable as it may aid even distribution of heat during the subsequent calcination process. If a uniform density is not provided by uniaxial pressing, then the pelletized mixture may optionally be isostatically pressed until the desired density uniformity is achieved.

Calcination

The method involves calcining the pelletized mixture. In some embodiments, the calcination step is performed in a furnace using, for example, a pre-set temperature program or using other variable temperature systems known by those of ordinary skill in the art. In some embodiments, the pelletized mixture is calcined at 700 to 1,000° C., preferably 800 to 975° C., preferably 850 to 950° C., more preferably 875 to 925° C., more preferably 900° C. to produce a calcined mixture. In some embodiments, the pelletized mixture is calcined for 8 to 16 hours, preferably 10 to 14 hours, preferably about 12 hours. The pelletized mixture may be calcined using an isothermal procedure or a non-isothermal procedure. When a non-isothermal procedure is utilized, the temperature may be ramped using various ramp rates, for example 0.1 to 10° C./min, preferably 0.3 to 8° C./min, preferably 0.5 to 7° C./min, preferably 0.8 to 6° C./min, preferably 1 to 5° C./min, including ramp rates outside of these ranges.

To ensure adequate removal of the barium salt anion (e.g., carbonate anion in $BaCO_3$), the calcined mixture may be optionally subjected to an intermediate grinding stage, for example with a mortar and pestle or a mechanical grinding machine, and then re-subjected to further calcination under similar or different conditions to those described above. For example, the calcination process may involve 1) a first calcination at 850 to 950° C. for 10 to 14 hours, 2) intermediate grinding, followed by 3) a second calcination at 900 to 1,150° C. for 20 to 24 hours. Various other modifications, such as changes of gaseous atmosphere, may also be practiced so long as suitable conversion of the barium salt to barium oxide is adequately achieved. Most preferably, the pelletized mixtures are subjected to two calcinations processes, for 12 hours at 900° C. with ramp rate of 5° C./min, each with intermediate grinding for the aim of producing an oxide precursor without residue of any carbonates. The obtained precursors were divided into two parts; the first part was grounded by hand using an agate pestle in the agate mortar. The second part was ball milled.

Ball Milling

After producing calcined mixtures without residue of any carbonates, the calcined mixtures are then ball milled to produce ball milled samples. A high energy ball mill is preferably used, for example, a standard ball mill, a planetary mill, a vibration mill, an attritor—stirring ball mill, a pin mill, or a rolling mill may be employed. In some embodiments, the calcined mixture is ball milled with a planetary ball mill.

Planetary ball mills are typically used for grinding sample material down to very small sizes. A planetary ball mill includes at least one grinding vial which is arranged eccentrically on a so-called sun wheel. The direction of movement of the sun wheel is opposite to that of the grinding vials. The grinding balls in the grinding vials are subjected to superimposed rotational movements, the so-called Coriolis forces. The difference in speeds between the balls and vials produces an interaction between frictional and impact forces, which releases high dynamic energies. Besides the typical mixing result of ball milling, the interplay between these forces in planetary ball milling produces the high and very effective degree of size reduction, and this high degree of fineness can be accomplished using short milling times. An example planetary ball mill useful in the disclosed method is a Retsch PM 200 F type planetary ball mill, Haan Germany.

The vials and balls used for the ball milling may be one or more of agate (cryptocrystalline silica), corundum ($Al_2O_3$), zirconium oxide ($ZrO_2$), stainless steel (Fe, Cr, Ni), tempered steel (Fe, Cr), and tungsten carbide (WC). In preferred embodiments, the balls are made of stainless steel (e.g., SS 316), for example, 6 mm SS316 ball bearings may be employed. In some embodiments, the calcined mixture is ball milled with stainless steel vials and balls.

In some embodiments, ball milling is performed in air (or a generally oxygen-containing atmosphere, e.g., which includes any atmosphere that contains at least 20%, preferably at least 40%, preferably at least 60%, preferably at least 80%, preferably at least 90%, preferably at least 95%, preferably at least 99%, or about 100% oxygen by volume). To avoid or reduce contamination, the ball milling may be carried out under an inert atmosphere such as under nitrogen or argon, preferably argon. In some embodiments, the weight of the calcined mixture (g) per volume (1,000 $cm^3$) of vials used in the ball milling is 50-150 g/1.000 $cm^3$, preferably 75-130 g/1,000 $cm^3$, preferably 90-110 g/1,000 $cm^3$.

As used in the present disclosure, "controlled ball billing" or ball milling under "controlled" conditions refers to a ball milling process that maintains a consistent, stable, and highly reproducible milling event by avoiding overly energetic milling parameters that can cause over-milling and over-heating of the ball system leading to unwanted morphology changes and diminishment of superconducting properties. The phrase controlled ball milling is not to be confused with low energy ball milling methods, as high energy ball milling (e.g., planetary ball milling) techniques may be employed herein under particular parameters. Parameters used herein for "controlled" ball milling are now described below.

The ball to powder ratio (BPR) represents the weight ratio of the milling balls to the calcined mixture charge. The ball to powder ratio used herein may range from 1:1 to 4:1, preferably 3:2 to 7:2, preferably 2:1 to 3:1, most preferably 5:2.

The calcined mixture may be ball milled at a rotational speed of 200 to 600 rpm, preferably 250 to 550 rpm, preferably 300 to 500 rpm, preferably 350 to 450 rpm, most preferably 400 rpm.

The milling time may also influence the product morphology and superconducting properties of the produced polycrystalline Y-358 material. Suitable milling times that may be practiced herein range from 2 to 8 hours, preferably 2.5 to 6 hours, preferably 3 to 5 hours, preferably 3.5 to 4.5 hours, most preferably about 4 hours.

For controlled ball milling, it is also preferred to maintain a relatively low and consistent temperature within the ball mill throughout the milling operation, for example, a milling temperature of less than 150° C., preferably less than 100° C., preferably less than 80° C. preferably less than 60° C., preferably less than 40° C., for example 20 to 35° C. The milling temperature herein is an average temperature within the mill, which can be measured by direct calorimetric measurements of the milling balls or vials, and not a measurement of maximum local temperatures generated transiently during impact between the powder and/or colliding milling tools.

While the calcined mixture may in certain circumstances be ball milled continuously over the entire milling time (e.g., 4 hours), such continuous operation may inadvertently cause elevated temperatures or temperature spikes (uncontrolled milling temperatures) that may negatively impact the final product. Therefore, in preferred embodiments, the calcined mixture is ball milled non-continuously over the selected milling time. Such non-continuous operation typically entails ball milling in increments of 10 to 60 minutes, preferably 15 to 50 minutes, preferably 20 to 40 minutes, preferably 25 to 30 minutes, separated by periods of inactivity ("cooling off periods") ranging from 1 to 15 minutes, preferably 5 to 10 minutes, to control and maintain a more consistent maximum milling temperature over the entire ball milling operation. For example, a non-continuous ball milling operation may include cycles of ball milling for 25 minutes, cooling off for 5 minutes, then restarting the cycle again until a total milling time of 4 hours is reached (i.e., the milling time is the sum of all active milling periods and all cooling off periods).

On the other hand, uncontrolled ball milling, i.e., overly energetic ball milling, generally involves application of a BPR, a rotational speed, a milling time, and/or a milling temperature that fall outside of the above described controlled ball milling ranges. For example, a method that employs a BPR of 5:1 or more, a rotational speed of 700 rpm or more, a milling time of 10 hours or more, a milling temperature of 200° C. or more, or any combination of two or more of these parameters would be considered herein as "uncontrolled" ball milling.

In preferred embodiments, the calcined mixture which is subjected to ball milling consists of or consists essentially of yttrium, barium, and copper oxides, and a process control agent is not employed in order to avoid contamination during said ball milling process. Process control agents that are typically excluded herein, include, but are not limited to, organic acids or salts thereof (e.g., stearic acid, oxalic acid, benzoic acid, sodium stearate), polymers (e.g., polyvinyl alcohol, cellulose polymers such as sodium carboxymethyl cellulose, polyethylene glycol), alcohols (e.g., methanol, ethanol, isobutyl alcohol), aluminum-containing compounds (e.g., aluminum tri-sec-butylate, aluminum chloride), alkanes (e.g., hexane), potassium carbonate, as well as any other process control agent known by those of ordinary skill in the art.

Surprisingly, it has been found that methods utilizing a controlled ball milling step afford polycrystalline Y-358 materials with superior superconducting properties, while the use of uncontrolled ball milling may negatively impact the superconducting properties of the polycrystalline Y-358 material compared to unmilled samples. Therefore, as will become clear, methods utilizing controlled ball milling>other milling techniques (e.g., hand grinding/milling)>uncontrolled ball milling, in terms of making polycrystalline Y-358 material with desirable superconducting properties. While not bound by theory, this may be due to the morphology produced using controlled ball milling.

Sintering

After milling, the produced hand grinded and ball milled samples may then be sintered, which is the process of compacting and forming a solid mass of material by heat or pressure without melting it to the point of liquefaction. In some embodiments, the ball milled sample is sintered at 800 to 1100° C., preferably 850 to 1050° C., preferably 900 to 1000° C., most preferably at 950° C.

In preferred embodiments, the ball milled sample is sintered in an oxygen environment, which includes any environment that contains at least 20%, preferably at least 40%, preferably at least 60%, preferably at least 80%, preferably at least 90%, preferably at least 95%, preferably at least 99%, or about 100% oxygen by volume.

In some embodiments, the ball milled sample is sintered for up to 72 hours, preferably 6 to 72 hours, preferably 12 to 60 hours, most preferably for 48 hours. Sintering may also optionally be performed above atmospheric pressure, for example at a pressure of 200 to 900 MPa, preferably 500 to 800 MPa, preferably 700 to 775 MPa, most preferably about 750 MPa. After sintering and optionally cooling to room temperature, the polycrystalline Y-358 material is formed.

Product Morphology

The polycrystalline $Y_3Ba_5Cu_8O_y$ material produced from the methods disclosed herein is in the form of a matrix of elongated grains/crystals which are separated by grain boundaries. The elongated crystals may have a variety of shapes, including cylindrical and cuboid shapes. In some embodiments, the elongated crystals have an average length of 1 to 20 µm, preferably 1 to 15 µm, most preferably 2 to 10 µm and an average width of 0.5 to 3 µm, preferably 1 to 2.5 µm, most preferably 1 to 2 µm.

Figure 2A:
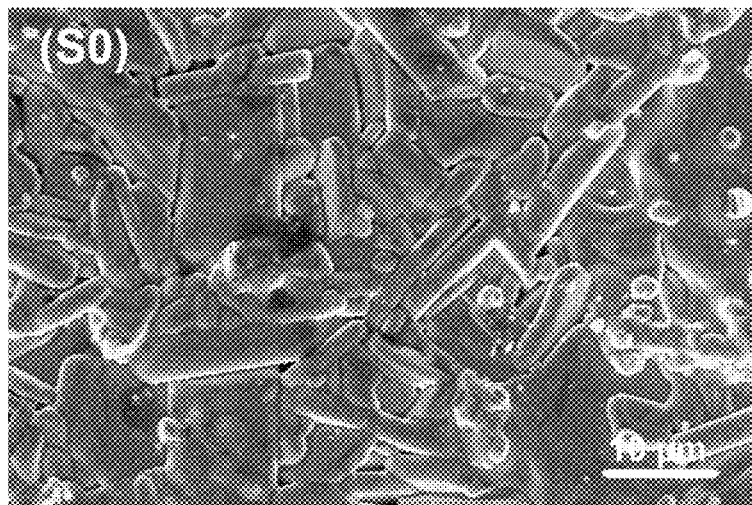
FIG. 2A is a low magnification SEM micrograph of the overview of S0-hand grinded sample.
Figure 2B:
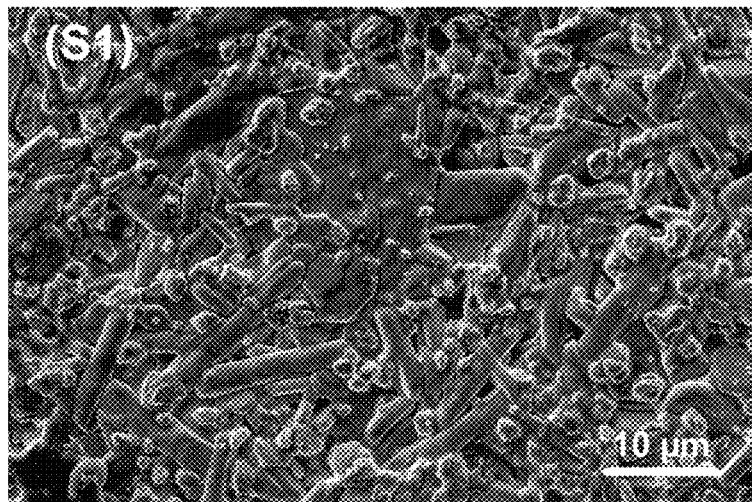
FIG. 2B is a low magnification SEM micrograph of the overview of S1 ball milled sample.
Figure 2C:
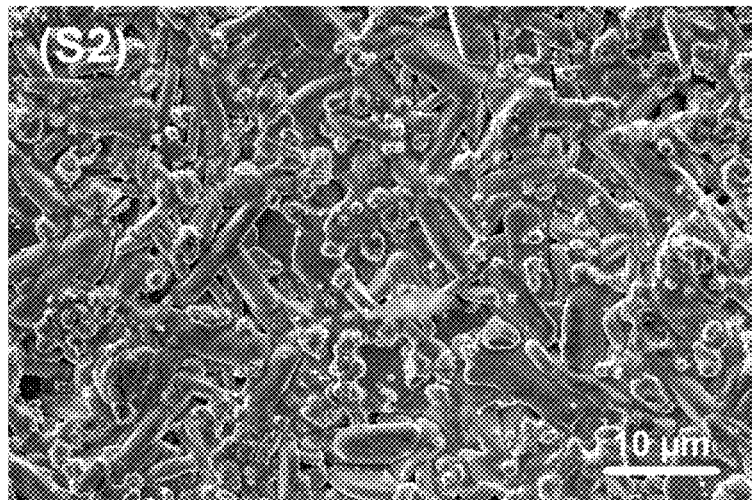
FIG. 2C is a low magnification SEM micrograph of the overview of S2 ball milled sample.
Figure 2D:
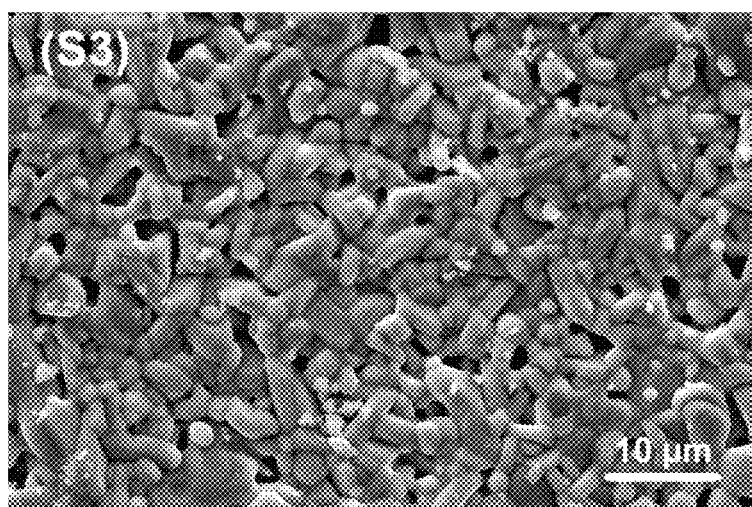
FIG. 2D is a low magnification SEM micrograph of the overview of S3 ball milled sample.

These elongated crystals may have an ordered or aligned orientation, whereby at least 60%, at least 70%, at least 80%, at least 90% of all elongated grains/crystals are arranged or oriented in the same or substantially the same direction as determined by SEM microscopy. In preferred embodiments, the matrix of the elongated grains/crystals are randomly oriented, that is, the elongated crystals are generally not aligned or oriented in the same direction along their longitudinal axis (see FIGS. 2B and 3B).

The polycrystalline $Y_3Ba_5Cu_8O_y$ material produced from the methods disclosed herein also include spherical nanoparticles of Yttrium deficient $Y_3Ba_5Cu_8O_y$ disposed on the elongated crystals. The spherical nanoparticles typically have an average diameter of 5 to 20 nm, preferably 6 to 15 nm, preferably 7 to 12 nm, preferably 9 to 11 nm, or about 10 nm. "Dispersity" is a measure of the homogeneity/heterogeneity of sizes of particles in a mixture. The coefficient of variation (CV), also known as relative standard deviation (RSD) is a standardized measure of dispersion of a probability distribution. It is expressed as a percentage and may be defined as the ratio of the standard deviation (σ) to the mean (µ, or its absolute value (|µ|), and it may be used to show the extent of variability in relation to the mean of a population. In a preferred embodiment, the spherical nanoparticles produced by the methods of the present disclosure have a narrow size dispersion, i.e., are monodisperse, with a coefficient of variation of less than 30%, preferably less than 25%, preferably less than 20%, preferably less than 15%, preferably less than 12%, preferably less than 10%, preferably less than 8%, preferably less than 5%, preferably less than 3%, with the coefficient of variation being defined in this context as the ratio of the standard deviation to the mean diameter of the spherical nanoparticles.

Figure 4A:
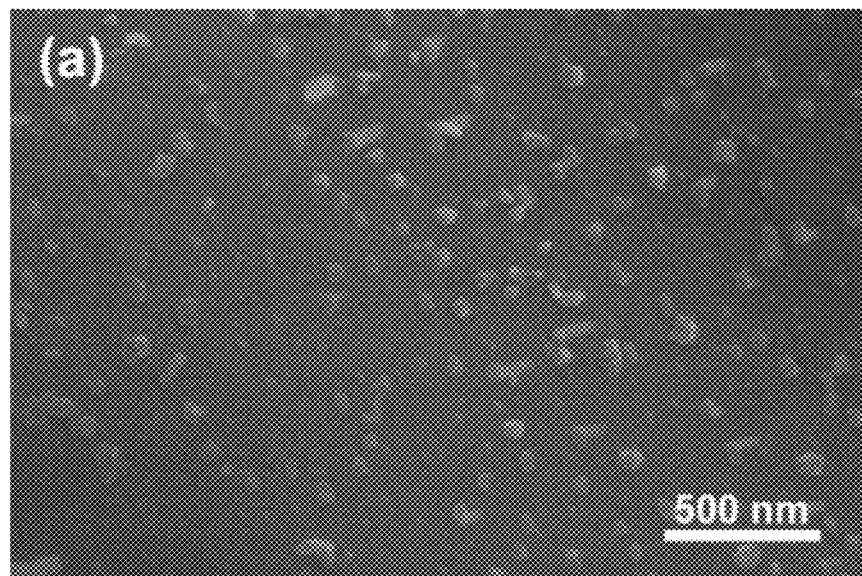
FIG. 4A is a high magnification SEM micrograph showing nano-particles generated by ball milling process embedded within Y-358.
Figure 4B:
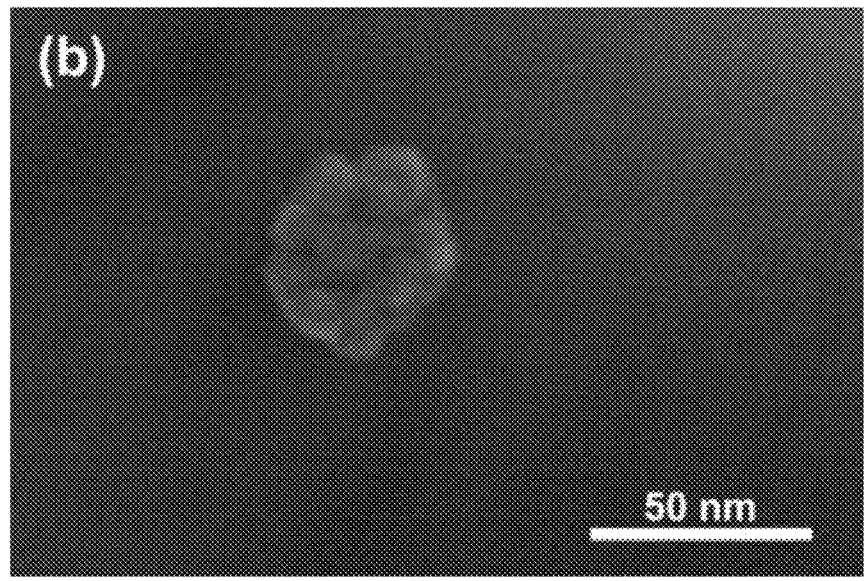
FIG. 4B is a high magnification SEM micrograph showing nano-particles with a flower-like morphology embedded within Y-358 with a 45 nm average scale.

Sphericity is a measure of how closely the shape approaches that of a mathematically perfect sphere, and is defined as the ratio of the surface area of a perfect sphere of the same volume to the surface area of the spherical nanoparticles (with unity being a perfect sphere). Preferably, the spherical nanoparticles have an average sphericity of at least 0.7, preferably at least 0.8, preferably at least 0.9, preferably at least 0.95. In some embodiments, the spherical nanoparticles are classified based on roundness, and are categorized herein as being sub-rounded, rounded, or well-rounded, preferably well-rounded, using visual inspection similar to characterization used in the Shepard and Young comparison chart (FIG. 4B).

In some embodiments, the spherical nanoparticles (microstructure) may be present on the elongated crystals in the form of agglomerates, wherein a plurality of spherical nanoparticles agglomerate, and thus share interconnected outer boundaries, to form a distinct agglomerated macrostructure. In preferred embodiments, the agglomerates have a flower-like morphology, such flower-like morphology being characterized by the presence of individual spherical nanoparticles arranged radially in a petal-like manner surrounding centrally located spherical nanoparticles, the centrally located spherical nanoparticles being analogous to the ovary of a flower (FIG. 4B).

In some embodiments, the flower-like agglomerates have an average particle size of 30 to 60 nm, preferably 35 to 55 nm, preferably 40 to 50 nm, preferably about 45 nm. The average particle size of agglomerates is measured according to an average of the largest particle dimensions of the agglomerates, that is, the largest possible agglomerate particle dimension is measured and averaged. In some embodiments, the agglomerates having the flower-like morphology are uniformly dispersed on the elongated crystals, that is, the spherical nanoparticles are clustered into agglomerates, and those agglomerates are spread evenly/uniformly over the matrix of elongated crystals (e.g., FIGS. 3B-3D, 4A and 4B).

Such flower-like agglomerates are different from the coral-like agglomerates (about 100 nm in size), previously observed in Y-123 materials [A. Hamrita, Y. Slimani, M. K. Ben Salem, E. Hannachi, L. Bessais, F. Ben Azzouz, M. Ben Salem Ceramics International, 40 (2014) 1461-1470—incorporated herein by reference in its entirety].

Figure 3A:
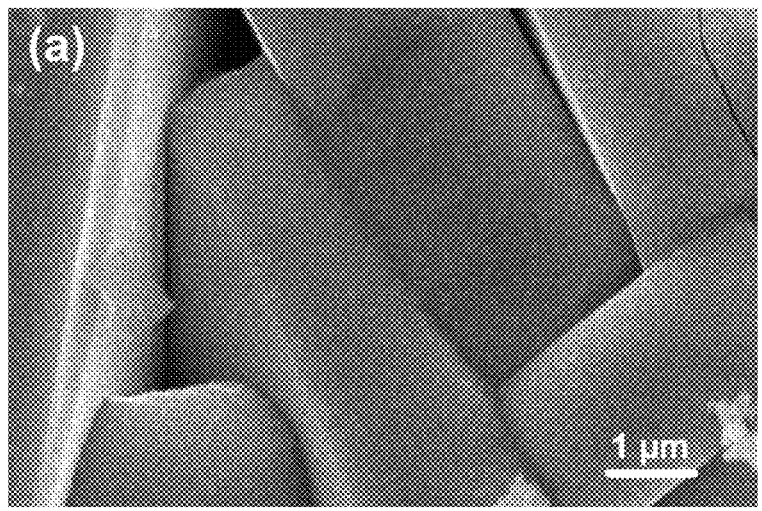
FIG. 3A is a high magnification SEM micrograph of the overview of S0-hand grinded sample.
Figure 3B:
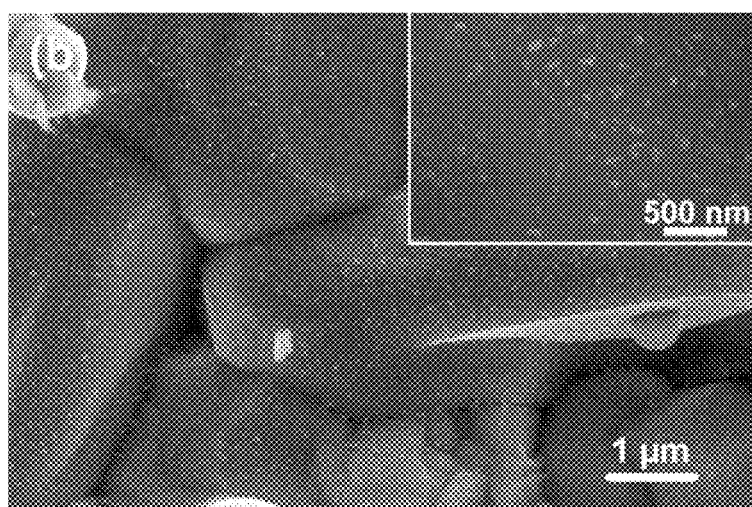
FIG. 3B is a high magnification SEM micrograph of the overview of S1 ball milled sample.
Figure 3C:
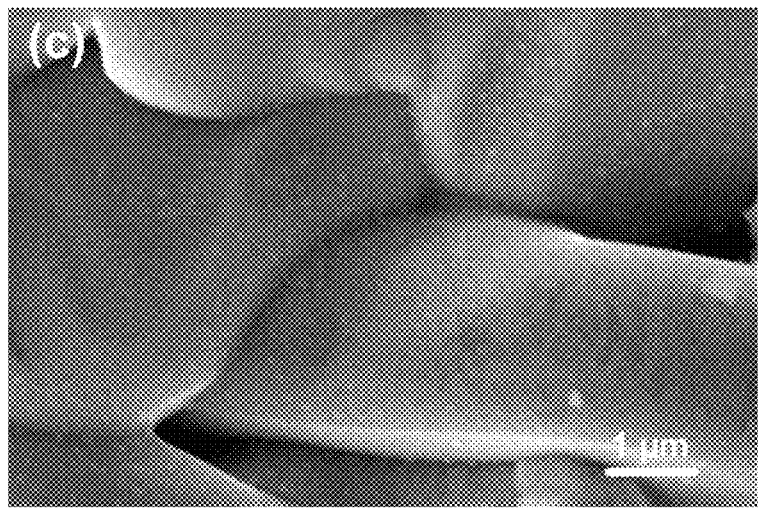
FIG. 3C is a high magnification SEM micrograph of the overview of S2 ball milled sample.
Figure 3D:
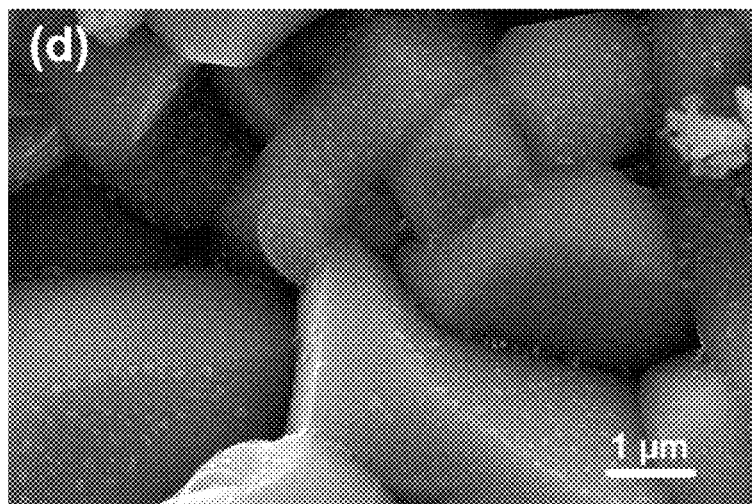
FIG. 3D is a high magnification SEM micrograph of the overview of S3 ball milled sample.

Contrary to ball milling-based methods, the use of other forms of milling/grinding (e.g., hand grinding with a mortar and pestle) forms only elongated crystals of $Y_3Ba_5Cu_8O_y$, with no observable spherical nanoparticles (FIG. 3A). Furthermore, it has been found that the amount of spherical nanoparticles formed increases with increasing intensity/energy of ball milling (as can be seen in FIGS. 3B-3D).

Product Properties

The methods of the present disclosure produce Y-358 materials with superior superconducting properties, which can be clearly seen by comparing the products produced by the inventive methods to those made using milling techniques other than ball milling. This may be due to the morphology produced with the controlled ball milling procedures disclosed herein, that is, the amount of spherical nanoparticles present on the elongated crystals. One measurement for determining the quantity of spherical nanoparticles formed is residual resistivity, $\rho_0$ which measures resistivity arising from impurity and imperfection scattering. Therefore, in the present disclosure, the residual resistivity may be correlated to the quantity of spherical nanoparticles, with higher residual resistivity values indicating a higher content of spherical nanoparticles. In preferred embodiments, the Y-358 materials provided herein have a residual resistivity of 0.3 to 0.55 mΩ·cm, preferably 0.33 to 0.5 mΩ·cm, preferably 0.36 to 0.48 mΩ·cm, most preferably 0.4 to 0.44 mΩ·cm. Such residual resistivity values are indicative of Y-358 materials having an advantageous content of spherical nanoparticles, while $\rho_0$ values above or below these ranges may be associated with polycrystalline Y-358 materials having inferior superconducting properties due to too many or too little (including none) spherical nanoparticles.

In some embodiments, the Y-358 materials provided herein have an advantageous intrinsic superconducting parameters, for example a lower critical magnetic field, $B_{c1}(0)$, of 5 to 10 T, preferably 5.5 to 8 T, preferably 6.0 to 7.5 T, most preferably 7 to 7.25 T, and an upper critical magnetic field, $B_{c2}(0)$, of 500 to 650 T, preferably 550 to 650 T, preferably 570 to 600 T, most preferably 580 to 585 T. On the other hand, methods instead involving hand grinding or uncontrolled ball milling have a $B_{c1}(0)$ of 4.41 T and 2.51 T, respectively, and a $B_{c2}(0)$ of 274 T and 109.6 T, respectively.

Critical current density is one measure of a materials ability to act as a superconductor, which is the point at which the vector sum of current densities is high enough to quench the superconducting state and the material transitions back to a normal state. In some embodiments, the polycrystalline $Y_3Ba_4Cu_8O_y$ produced by the methods herein has an estimated critical current density at temperature 0 K. $J_c(0)$, of 290 to 400×10$^3$ A·cm$^{-2}$, preferably 300 to 370×10$^3$ A·cm$^{-2}$, preferably 310 to 350×10$^3$ A·cm$^{-2}$, most preferably 320 to 330×10$^3$ A·cm$^{-2}$. Such a critical current density compares favorably to unmilled-based methods (e.g., $J_c(0)$ of 148.8× 10$^3$ A·cm$^{-2}$) and methods employing uncontrolled ball milling techniques (e.g., $J_c(0)$ of 60.17×10$^3$ A·cm$^{-2}$).

Figure 10A:
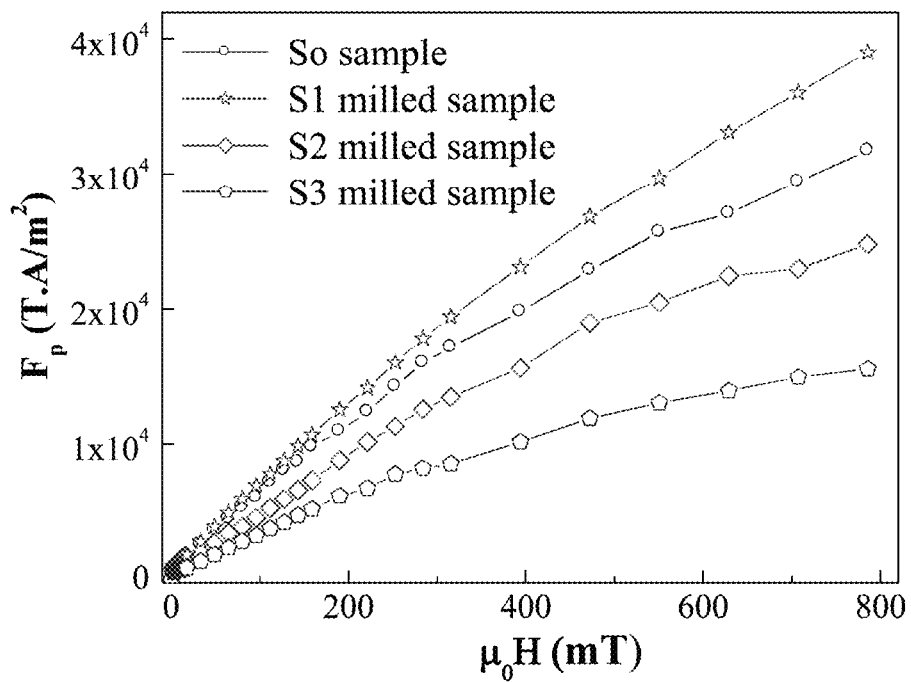
FIG. 10A is a plot of magnetic field dependencies of flux pinning force density $F_p(H)$ for S0-hand grinded and S1, S2, S3 ball milled samples.

Flux pinning force density, Fp (T·A/m$^2$) is measurement of sensitivity to magnetic field and flux pinning properties, with higher values indicating enhanced flux pinning and less sensitivity to magnetic fields. The products provided by the inventive methods have a superior flux pinning force density, $F_p$, compared to both hand ground samples and samples which have subject to over-milling (i.e., uncontrolled ball milling), under all applied magnetic fields up to 800 mT (FIG. 10A). Furthermore, ball milling Y-358 under controlled conditions greatly increases $F_p$ (e.g., more than a 2×10$^6$ T·A/m$^2$ increase at 1 T), compared to unmilled Y-358, while there is less observed difference in $F_p$ values between other yttrium-containing polycrystalline materials (e.g., Y-123) which have been subject to controlled ball milling and band grinding (an increase of only about 0.5×10$^6$ T·A/m² at 1 T, FIG. 10B). This is unexpected, and demonstrates that the inventive method does not enhance the superconducting properties of all yttrium-containing polycrystalline materials equally or to a similar extent.

Figure 7A:
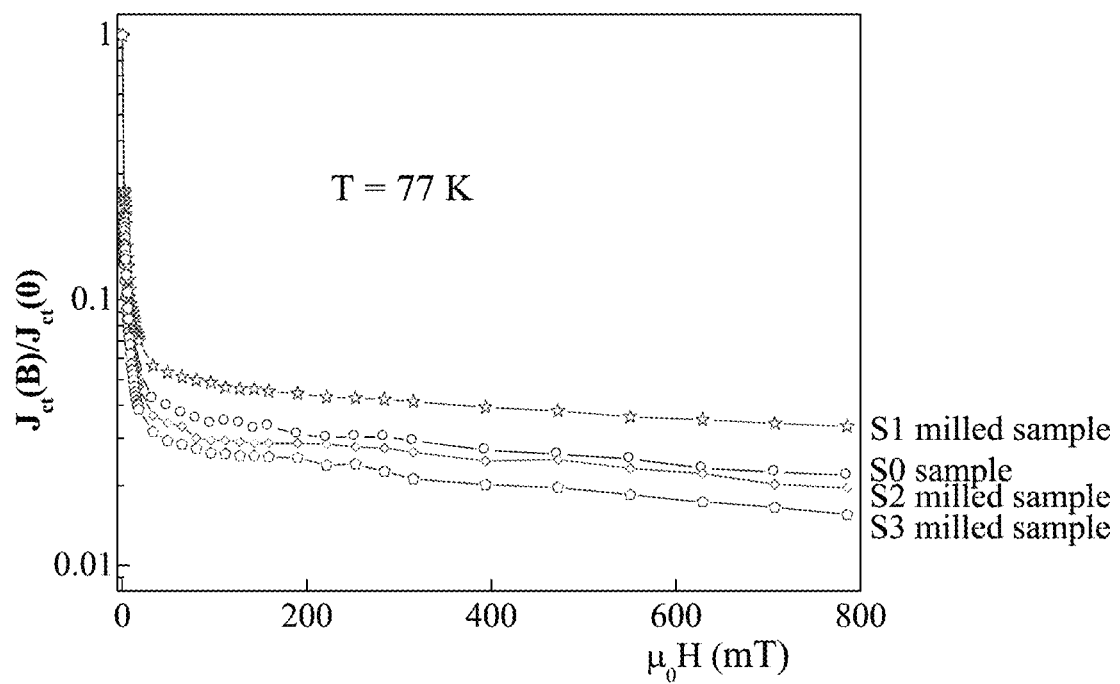
FIG. 7A is a plot of the dependence of the normalized transport critical current densities $J_{ctN}(H)$ with magnetic field for various Y-358 samples.
Figure 7B:
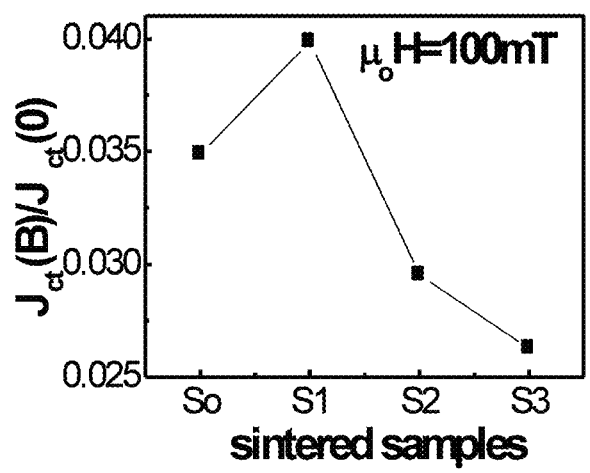
FIG. 7B is a plot of the normalized transport critical current densities $J_{ctN}(H)$ of various Y-358 samples at 100 mT.
Figure 7C:
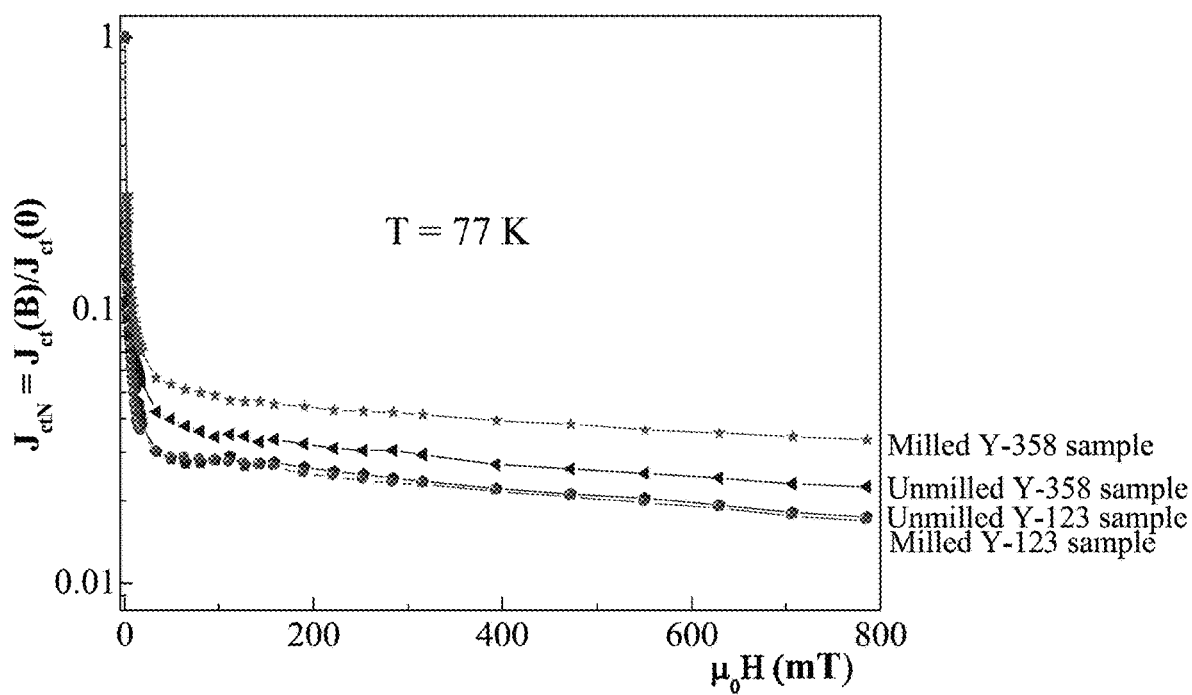
FIG. 7C is a plot of the dependence of normalized transport critical current densities $J_{ctN}(H)$ with magnetic field for unmilled (hand grinded) and ball milled $YBa_2Cu_3O_d$ (Y-123) and $Y_3Ba_5Cu_8O_y$ (Y-358) samples.

Normalized transport critical current density, $J_{ctN}$, where $J_{ctN}=J_{ct}(B)/J_{ct}(0)$, is another measure of sensitivity to magnetic field and flux pinning properties, with higher values indicating enhanced flux pinning and less sensitivity to magnetic field. Methods disclosed herein utilizing a controlled ball milling step produce polycrystalline $Y_3Ba_5Cu_8O_y$ materials having a $J_{ctN}$ of 0.039 to 0.045, preferably 0.040 to 0.044, preferably 0.041 to 0.043, most preferably about 0.042 under an applied transverse magnetic field $\mu_0H$ of 100 mT at 77 K. It can be appreciated that controlled ball milling enhances the $J_{ctN}$ value of polycrystalline Y-358 materials compared to unmilled products, while over-milling (i.e., uncontrolled ball milling) weakens the normalized transport critical current density property of the material (FIGS. 7A-7B). Furthermore, the inventive method results in a clear improvement in $J_{ctN}$ when applied to Y-358 materials compared to unmilled variants, whereas there is no appreciable observed difference in $J_{ctN}$ values between ball milled and hand ground samples of other yttrium-containing polycrystalline materials, e.g., Y-123 (FIG. 7C). This is unexpected, and once again demonstrates that the inventive method is suitable for enhancing the superconducting properties of Y-358, while other YBCO materials do not necessarily show a similar improvement.

In some embodiments, the polycrystalline Y-358 product has an offset superconducting transition temperature, $T_{co}$, of 91.0 to 92.4, preferably 91.4 to 92.2, preferably 91.8 to 92.0 K.

The superconducting $Y_3Ba_5Cu_8O_y$ materials produced in the present disclosure can be manufactured into rods, films, wires, tapes, coatings, coils, bulk materials, and the like, for various applications, such as in magnetic resonance imaging, particle accelerators, magnetic levitation, electric motors, bulk magnetic materials, electrical or computer components, power cables, power transmissions, transfer cable generators, frictionless bearings, Josephson junctions, and the like.

Having generally described this disclosure, a further understanding can be obtained by reference to certain specific examples which are provided herein for purposes of illustration only and are not intended to be limiting unless otherwise specified. The examples below are intended to further illustrate methods of preparing and characterizing the polycrystalline $Y_3Ba_5Cu_8O_y$ materials and they are not intended to limit the scope of the claims.

EXAMPLES

Experimental

Products of Y-358 were elaborated by solid state reaction by using two different milling methods, hand grinding in a mortar and ball milling in a planetary crusher. In accordance to the chemical formula of Y:3/Ba:5/Cu:8, the starting powders of $Y_2O_3$, $BaCO_3$, and CuO were mixed in an agate mortar by hand grinding using an agate pestle. The mixture was pressed uniaxially into pellets under an applied pressure of 100 MPa and thereafter subjected to two calcinations processes for 12 h at 900° C. each with intermediate grinding for the sake of producing an oxide precursor without residue of any carbonates. The obtained precursor was divided into two parts; the first part was grounded by hand per an agate pestle in the agate mortar. The second part was milled using Retsch PM 200 F type planetary ball milling technique with stainless steel balls and vial for 4 hours with various processing parameters. The number of balls, the ball to powder weight ratio and the speed rotation were varied. The process of milling was paused every 25 min for 5 min in favor of cooling the system down and reverse rotation. The precursors powders were then pelletized under an applied pressure of 750 MPa and heated in an oxygen atmosphere for 48 h at 950° C. The samples elaborated through sintering of planetary ball-milled precursor powder are named as S1, S2 and S3. For hand grinded precursor, the sintered sample is named S0. The notation and experimental variables for all elaborated products are summarized in Table 1.

TABLE 1

Notation and experimental conditions of ball milling parameters.

| Processing ball-milling parameters | Sample notation | | | |
|---|---|---|---|---|
| | S0 | S1 | S2 | S3 |
| Number of balls | — | 3 | 3 | 4 |
| Ball-to-powder weight ratio | — | 5:2 | 5:2 | 5:1 |
| Rotation speed | — | 400 | 600 | 600 |

Product Properties

XRD and SEM Characterizations

XRD data (FIG. 1) confirms the formation of a mainly Y-358 single phase with a small quantity of secondary phases identified with (*) and (+) in spectrum.

FIGS. 2A-2D showed that the average grain size is smaller for ball milled samples compared to hand grinded one meaning that the planetary high energy ball milling technique has a significant impact on the microstructure of sintered samples. The different samples are formed by elongated crystals that have an average length of 2 to 10 μm and an average width of 1 to 2 μm.

The images of FIGS. 3B-3D, taken under higher magnification, showed bright nanometer scale entities with almost regular form dispersed on the matrix relating to the milled samples. Such nano-entities are not visible in hand grinded sample (FIG. 3A). The density of these nano-entities is raised on increasing the weigh ball-powder proportion and the speed rotation.

A closer look at much higher magnification (FIG. 4A) shows a spherical shape nano-entities with a size of about 10 nm dispersed finely and relatively uniformly within the matrix. These nano-entities stick together forming flower-like agglomerates (FIG. 4B).

The clumping of fine grains incorporated in the superconductor will lead to more disorder in the crystal lattice that expect to amplify the vortices pinning centers and consequently improve the transport properties of the synthesized products.

Characterization of Superconducting Properties

Figure 5A:
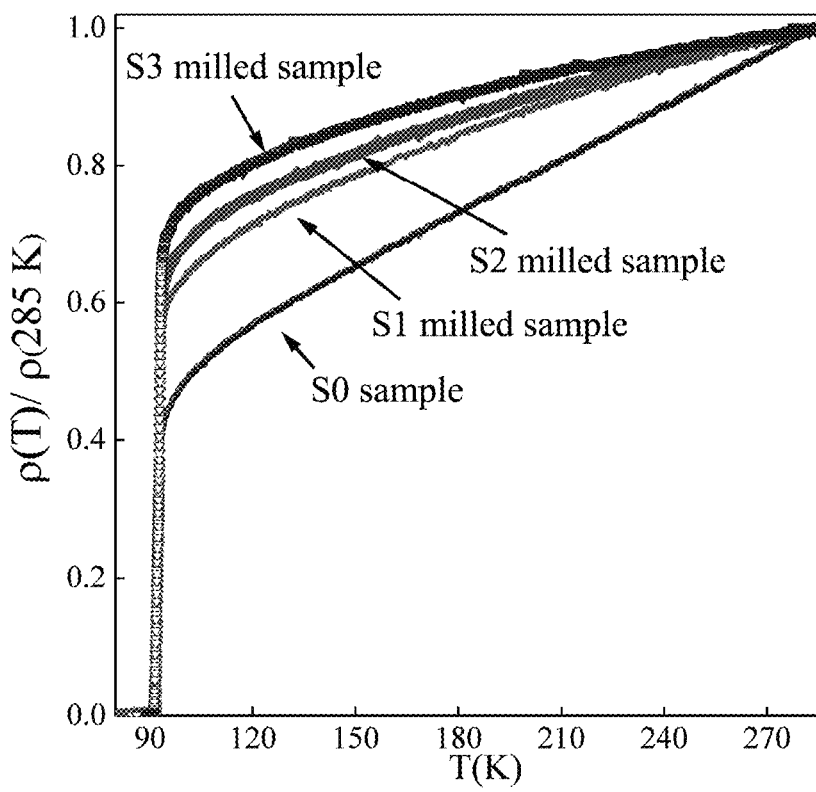
FIG. 5A is a plot of the temperature dependence of the normalized electrical resistivity for S0-hand grinded and S1, S2, S3 ball milled samples.

The methods of the present disclosure produce Y-358 materials with superconducting properties. Varying the number of balls, the rotation speed and the ball-to-powder weight ratio cause considerable disturbance of the microstructure in samples induced either by interfaces, heterogeneities or created defects. These differences manifest into differences in various superconducting parameters (FIG. 5A and Table 2).

TABLE 2

Characteristic parameters of different sintered samples.

| Sample notation | $T_{co}$ (K) | $T^*$ (K) | $T_c$ (K) | $\Delta T$ (K) | $\rho_n$ (m$\Omega\cdot$cm) | $\rho_o$ (m$\Omega\cdot$cm) |
|---|---|---|---|---|---|---|
| S0 | 92.68 | 118.22 | 93.24 | 0.84 | 0.98 | 0.29 |
| S1 | 91.85 | 140.31 | 92.99 | 1.49 | 0.71 | 0.41 |
| S2 | 91.71 | 148.52 | 92.88 | 1.51 | 0.79 | 0.53 |
| S3 | 91.17 | 161.88 | 92.87 | 2.10 | 1.28 | 0.98 |

The increase in the residual resistivity, $\rho_0$, can be explained by the larger number of defects and heterogeneities induced by planetary high energy ball milling technique. Therefore, in the present disclosure, the residual resistivity may be correlated to the quantity of spherical nanoparticles, with higher residual resistivity values indicating a higher content of spherical nanoparticles. The milled samples exhibit higher residual resistivity compared to the hand grinded one. The residual resistivity increases with increasing the various processing parameters such as the number of balls, speed rotation and the number of ball-powder.

Figure 5B:
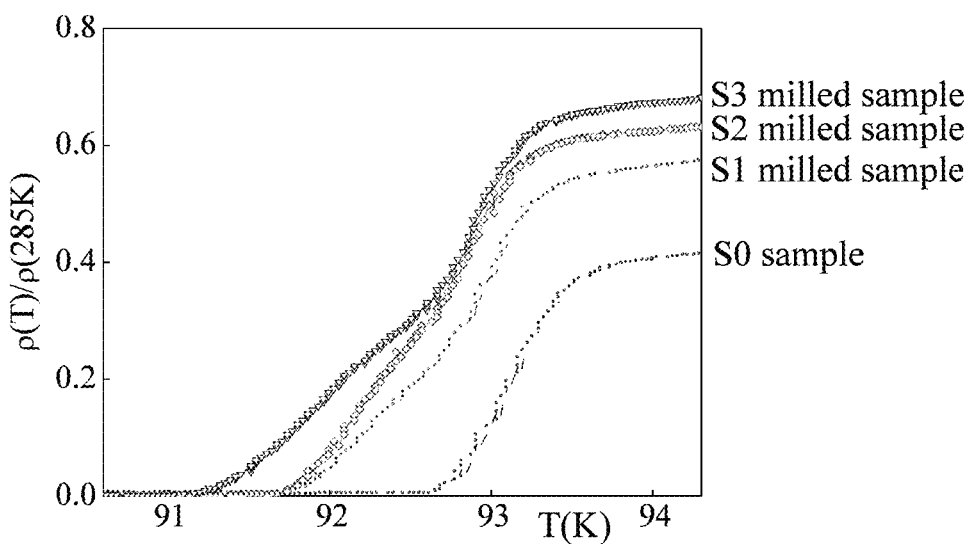
FIG. 5B is the curves in the transition region from FIG. 5A.

The hand grinded sample (S0) exhibits a single transition to the superconducting state, however, the milled ones exhibit a double superconducting transition (FIG. 5B). This can be confirmed by plotting dp/dT versus temperature or $\Delta\sigma^{-2}$ versus temperature (FIG. 6A-6D). For example, the presence of one maximum in plots of dp/dT versus temperature for the S0 unmilled sample indicates the occurrence of a single transition to the superconducting state (FIG. 6A), however the observation of two maximums for milled samples indicates the presence of a double superconducting transition (FIG. 6B-6D). It is assumed that the double transition, which is not observed in the case of hand grinded sample, seems to arise from the nano-entities generated by the planetary high energy ball milling technique.

Normalized transport critical current density, $J_{ctN}$, where $J_{ctN}=J_{ct}(B)/J_{ct}(0)$, is a measure of sensitivity to magnetic field and flux pinning properties, with higher values indicating enhanced flux pinning and less sensitivity to magnetic field. It can be appreciated that controlled ball milling enhances the $J_{ctN}$ value of polycrystalline Y-358 materials compared to hand grinded products. The optimized ball milled sample (S1) exhibits less sensitivity to magnetic field and $J_{ctN}$ values are higher throughout the considered whole range of magnetic field when compared to those of hand grinded (S0) and other ball milled (S2 and S3) samples (FIG. 7A). The optimized ball milled polycrystalline $Y_3Ba_5Cu_8O_y$ material has a $J_{ctN}$ of 0.042 under an applied transverse magnetic field $\mu_0H$ of 100 mT at 77 K, which is higher compared to that for hand grinded samples where $J_{ctN}$ is around 0.026 (FIG. 7B). The nano-entities induced by the use of appropriate and well-controlled ball milling parameters could act as efficient pinning sources resulting in a global improvement of flux pinning properties.

In comparison to hand grinded and ball milled Y-123, the hand grinded and ball milled Y-358 samples exhibit higher values of critical current density proving better intrinsic superconducting properties in Y-358 compounds (FIG. 7C). The Y-358 samples exhibit less sensitivity to magnetic field and $J_{ctN}$ values are higher throughout the considered whole range of magnetic field when compared to those of other yttrium-containing polycrystalline materials, e.g., Y-123 (FIG. 7C). The obtained result reveals that the optimized ball milled Y-358 product displays the better flux pinning characteristics. This is unexpected, and once again demonstrates that the inventive method is suitable for enhancing the superconducting properties of Y-358, while other YBCO materials do not necessarily show a similar improvement.

Figure 8A:
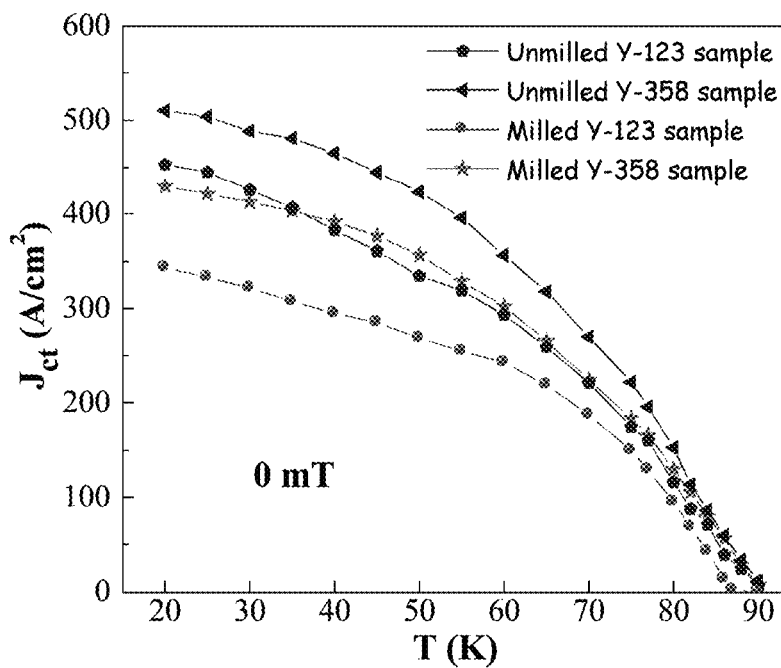
FIG. 8A is a plot showing the temperature dependence of transport critical current density $J_{ct}$ in an applied magnetic field of 0 mT for band grinded and ball milled Y-123 and Y-358 samples.
Figure 8B:
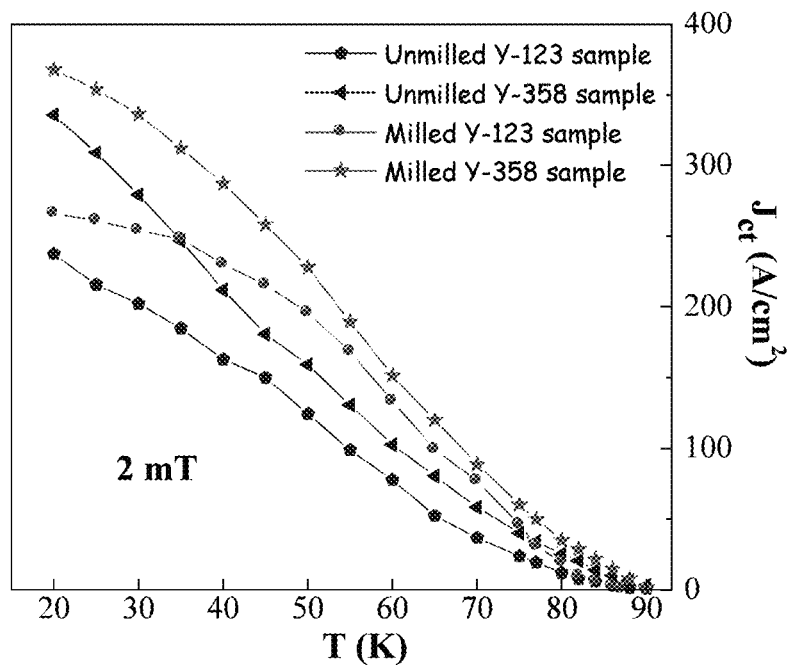
FIG. 8B is a plot showing the temperature dependence of transport critical current density $J_{ct}$ in an applied magnetic field of 2 mT for hand grinded and ball milled Y-123 and Y-358 samples.
Figure 8C:
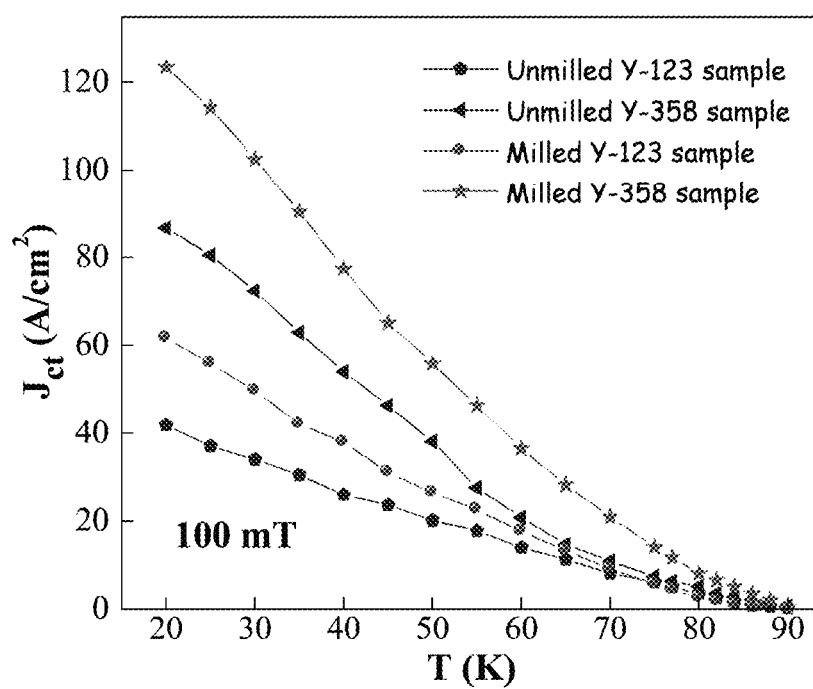
FIG. 8C is a plot showing the temperature dependence of transport critical current density $J_{ct}$ in an applied magnetic field of 100 mT for hand grinded and ball milled Y-123 and Y-358 samples.

All samples exhibit an improvement of $J_{ct}(T)$ in the whole temperature range between close to $T_{co}$ and down to T=20 K. $J_{ct}(T)$ values of milled samples are drastically better in the existence of external magnetic fields compared to unmilled ones. This result confirms once again the beneficial effect of well-dispersed nano-entities induced by planetary HEBM technique in the enrichment of the flux pinning properties. The performances of milled Y-358 product are better over the entire temperature range (FIGS. 8A-8C).

Figure 9A:
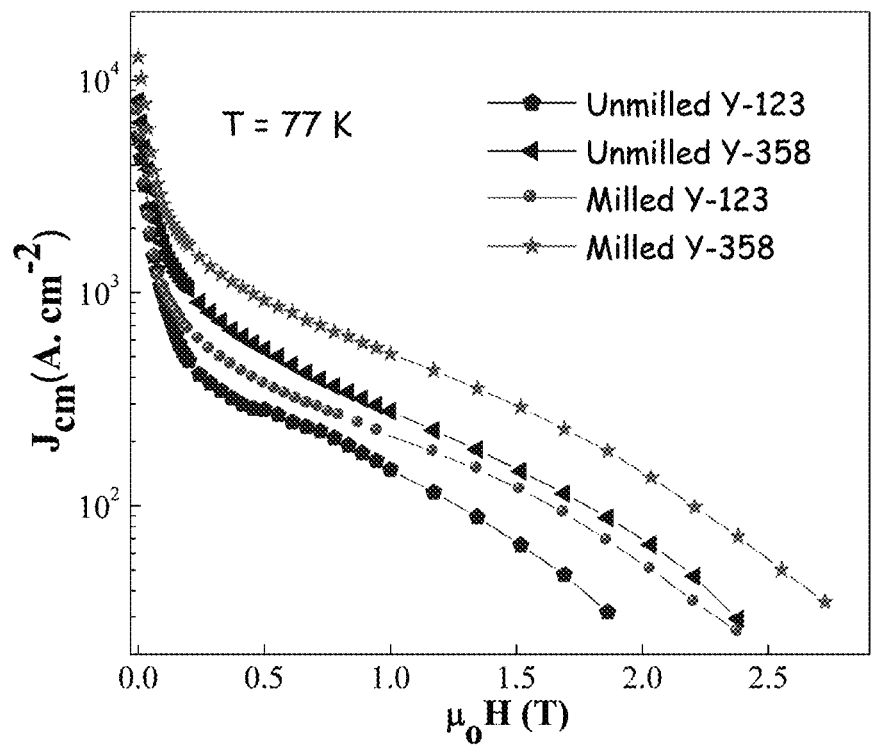
FIG. 9A is a plot of magnetization critical current density $J_{cm}$ estimated from magnetization loops versus magnetic field (M-H) at 77 K for hand grinded and ball milled Y-123 and Y-358 samples.
Figure 9B:
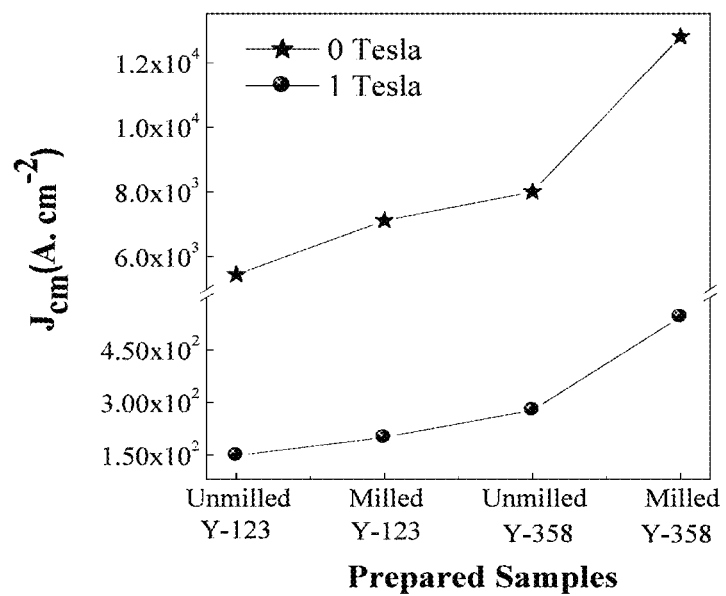
FIG. 9B is a plot of magnetization critical current density $J_{cm}$ at a magnetic field of 0 and 1 Tesla at 77 K for hand grinded and ball milled Y-123 and Y-358 samples.

The hand grinded Y-358 product displays noticeably higher magnetization critical current density, $J_{cm}(H)$, values in comparison to the hand grinded Y-123, at least in part due to better intra-granular characteristics in Y-358 (FIG. 9A). $J_{cm}$ is improved significantly in the ball milled Y-358 sample compared to ball milled Y-123 at both 0 and 1 Tesla (FIG. 9B). The high energy ball milling technique leads to a larger improvement of magnetization critical current density for the Y-358 compound compared to the Y-123 ball milled variant. In some embodiments, the optimized ball milled polycrystalline $Y_3Ba_5Cu_8O_y$ has a magnetization critical current density $J_{cm}$ of $14\times10^3$ A·cm$^{-2}$ and 550 A·cm$^{-2}$ at 0 Tesla and 1 Tesla, respectively. However, the optimized ball milled polycrystalline $YBa_2Cu_3O_d$ has lower $J_{cm}$ with values around $7.0\times10^3$ A·cm$^{-2}$ and 200 A·cm$^{-2}$ at 0 Tesla and 1 Tesla, respectively.

The S1 milled sample exhibits less sensitivity to magnetic field and flux pinning force density $F_p$ values are higher throughout the considered whole range of magnetic field when compared to those of S0, S2 and S3 materials (FIG. 10A). That is to say, the flux pinning in S1 milled sample has been enhanced compared to the other products. The nano-entities induced by the use of appropriate and well-controlled ball milling parameters could act as efficient pinning sources resulting in a global improvement of flux pinning properties.

Figure 10B:
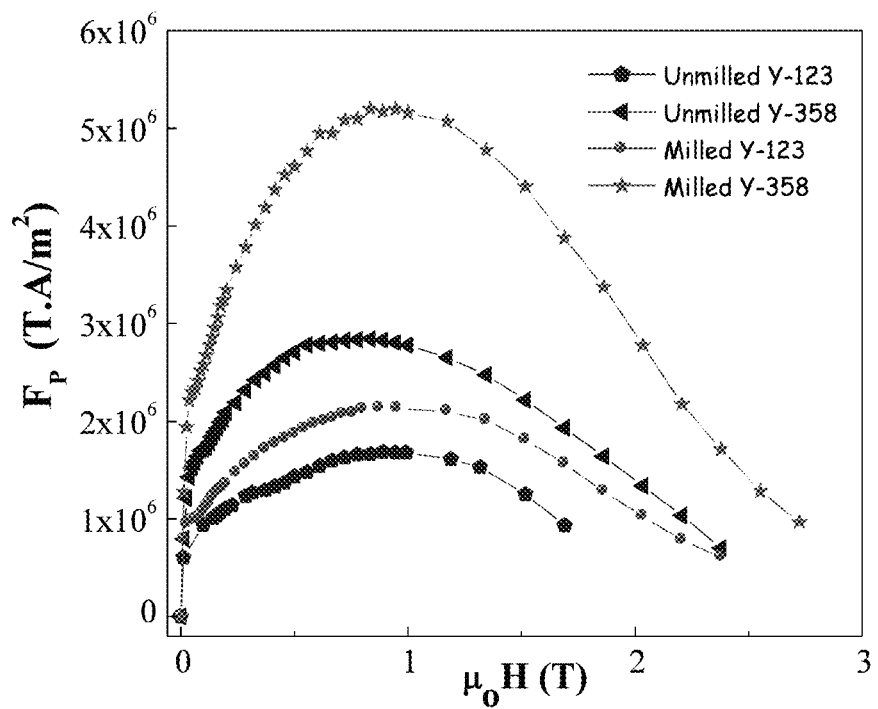
FIG. 10B is a plot of magnetic field dependence of the flux pinning force density at 77 K for unmilled (hand grinded) and ball milled Y-123 and Y-358 samples.
Figure 11A:
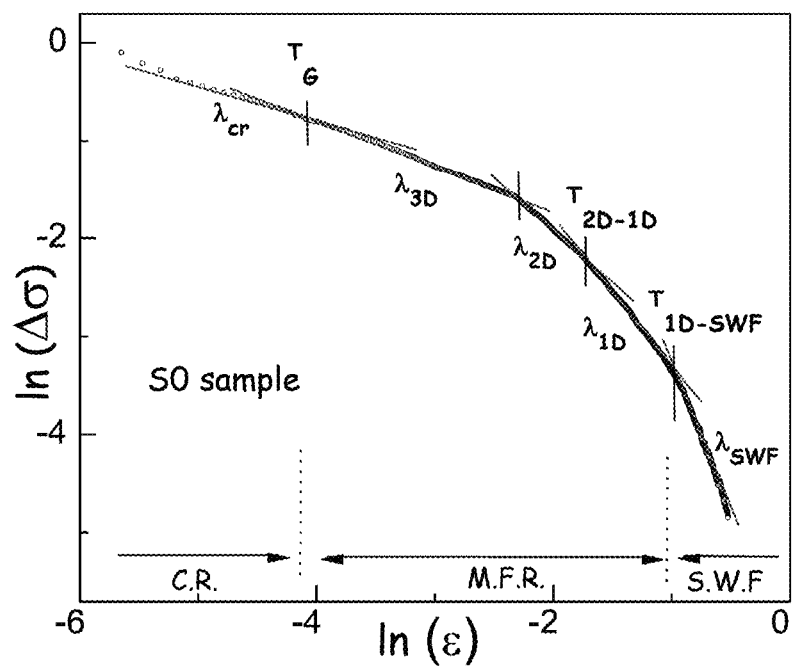
FIG. 11A is a logarithmic plot of excess conductivity $\Delta\sigma$ as a function of the reduced temperature $\varepsilon$ for S0 hand grinded sample.
Figure 11B:
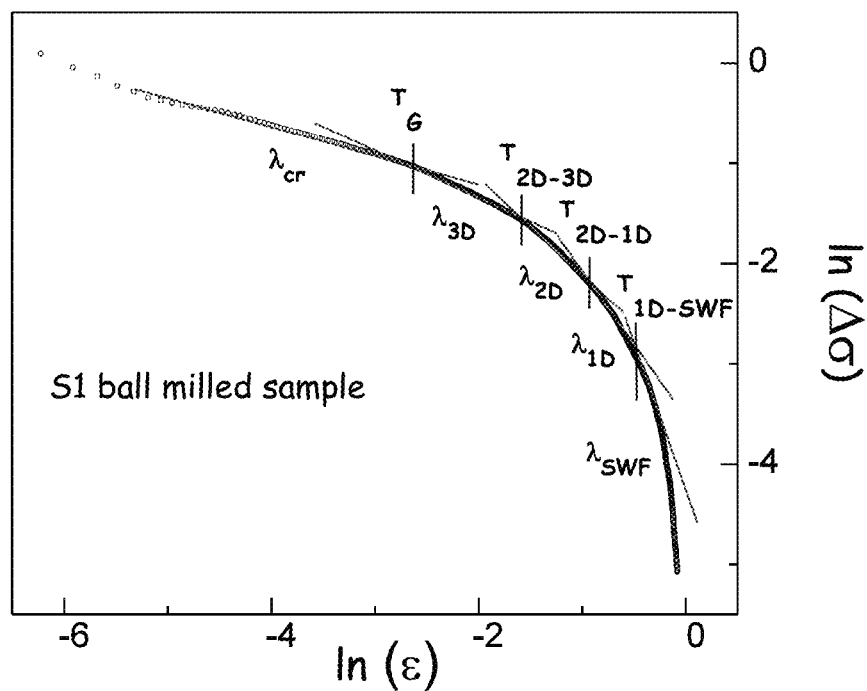
FIG. 11B is a logarithmic plot of excess conductivity $\Delta\sigma$ as a function of the reduced temperature $\varepsilon$ for S1 ball milled sample.
Figure 11C:
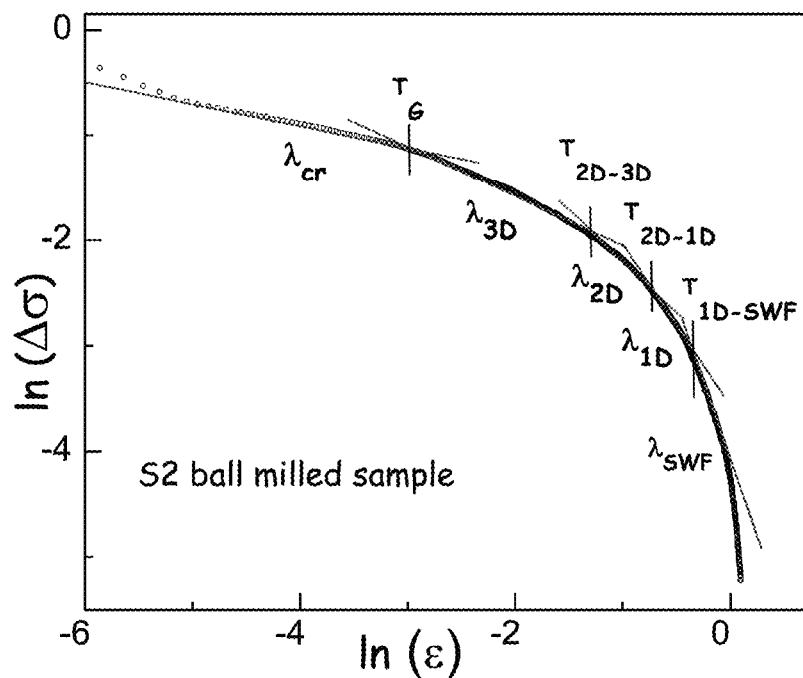
FIG. 11C is a logarithmic plot of excess conductivity $\Delta\sigma$ as a function of the reduced temperature $\varepsilon$ for S2 ball milled sample.
Figure 11D:
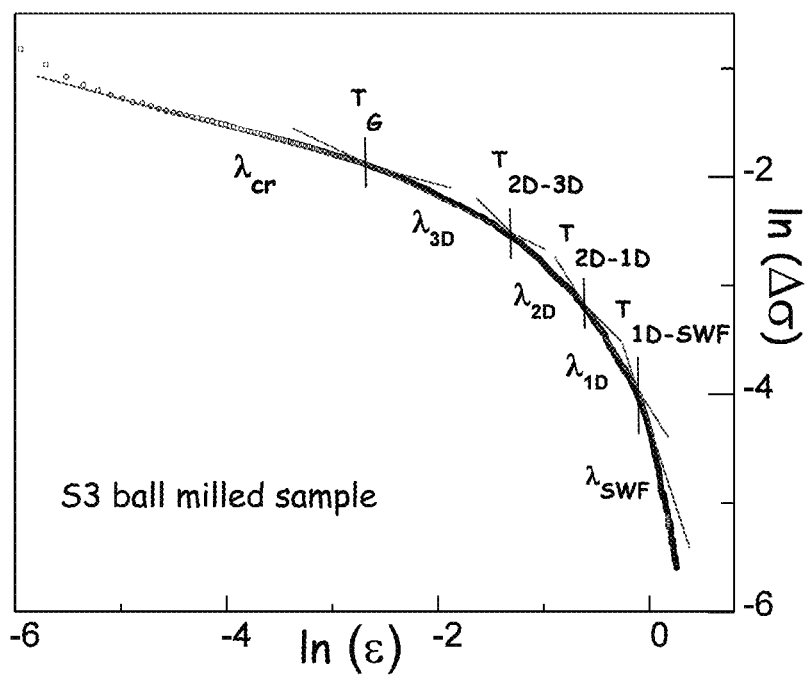
FIG. 11D is a logarithmic plot of excess conductivity $\Delta\sigma$ as a function of the reduced temperature $\varepsilon$ for S3 ball milled sample.
Figure 12A:
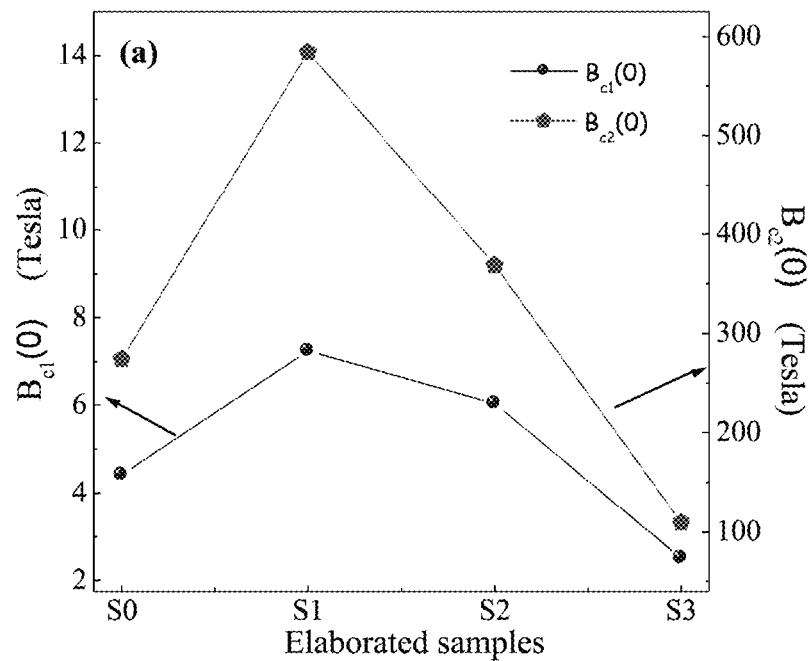
FIG. 12A is a plot of evolutions of critical magnetic fields ($B_{c1}(0)$ and $B_{c2}(0)$) for different sintered samples.
Figure 12B:
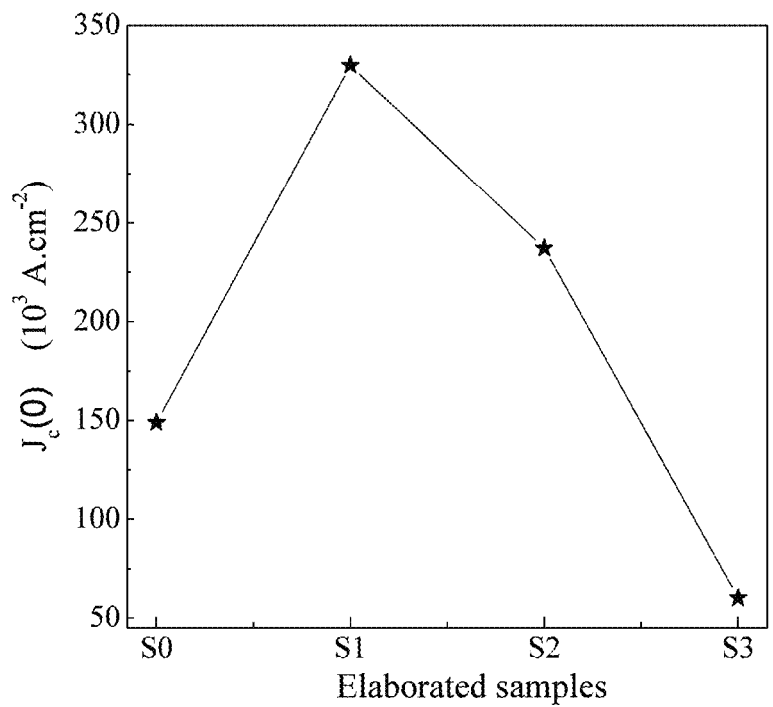
FIG. 12B is a plot of evolutions of critical current density at T=0K, $J_c(0)$, for different sintered samples.

The milled Y-358 exhibits a distinctly higher flux pinning force density $F_p$ and the planetary high energy ball milling technique once again strengthens the flux pinning properties of this product in comparison to that of Y-123, which shows a much smaller observed difference between milled and unmilled Y-123 materials (FIG. 10B).

TABLE 3

Conductivity exponents and cross-over temperatures values for different sintered samples.

| Sample notation | $\lambda_{SWF}$ | $\lambda_{1D}$ | $\lambda_{2D}$ | $\lambda_{3D}$ | $\lambda_{cr}$ | $T_{SWF-1D}$ (K) | $T_{1D-2D}$ (K) | $T_{2D-3D}$ (K) | $T_G$ (K) |
|---|---|---|---|---|---|---|---|---|---|
| S0 | 2.97 | 1.51 | 1.04 | 0.47 | 0.34 | 122.92 | 109.8 | 102.92 | 94.79 |
| S1 | 2.94 | 1.46 | 0.96 | 0.48 | 0.30 | 149.18 | 129.04 | 111.9 | 97.88 |

TABLE 3-continued

Conductivity exponents and cross-over temperatures values for different sintered samples.

| Sample notation | $\lambda_{SWF}$ | $\lambda_{1D}$ | $\lambda_{2D}$ | $\lambda_{3D}$ | $\lambda_{cr}$ | $T_{SWF\text{-}1D}$ (K) | $T_{1D\text{-}2D}$ (K) | $T_{2D\text{-}3D}$ (K) | $T_G$ (K) |
|---|---|---|---|---|---|---|---|---|---|
| S2 | 2.95 | 1.53 | 0.96 | 0.47 | 0.21 | 160.16 | 137.52 | 115.8 | 98.38 |
| S3 | 2.95 | 1.54 | 0.96 | 0.47 | 0.22 | 173.31 | 145.84 | 119.84 | 99.06 |

TABLE 4

Physical parameters associated with fluctuation-induced conductivity (FIC).

| Sample notation | $N_G \times 10^{-2}$ | $\xi_c(0)$ (Å) | d (Å) | s (Å²) | J | $B_c(0)$ (Tesla) | $B_{c1}(0)$ (Tesla) | $B_{c2}(0)$ (Tesla) | $J_c(0)$ (×10³ A·cm⁻²) |
|---|---|---|---|---|---|---|---|---|---|
| S0 | 1.63 | 10.96 | 87.12 | 1008.87 | 0.0632 | 24.10 | 4.41 | 274.17 | 148.80 |
| S1 | 6.31 | 7.50 | 32.53 | 195.62 | 0.2126 | 43.32 | 7.24 | 584.39 | 329.57 |
| S2 | 4.84 | 9.44 | 35.98 | 254.49 | 0.2753 | 32.75 | 6.04 | 368.47 | 237.17 |
| S3 | 6.67 | 17.32 | 65.68 | 815.73 | 0.2781 | 12.18 | 2.51 | 109.64 | 60.17 |

The excess conductivity investigation of $Y_3Ba_5Cu_8O_y$ superconductors prepared by various parameters of planetary High Energy Ball Milling technique were examined (FIGS. 11A-11D, FIGS. 12A-12B, and Tables 3 and 4). In FIGS. 11A-11D, the abbreviations C.R., M.F.R. and S.W.F. stand for critical region, mean-field region and short-wave fluctuation region, respectively.

The lower critical magnetic field ($B_{c1}(0)$), upper critical magnetic field ($B_{c2}(0)$) and critical current density at T=0K ($J_c(0)$) are improved for S1 and S2 ball milled samples compared to S0 unmilled (hand grinded) sample. It is noticeable that the enhancement of these parameters reaches the highest values for S1. The structure of multi-layers and the existence of greater number of insulating layers interpolated between the planes $CuO_2$ playing as efficient intrinsic pinning centers and the generated nano-entities by high energy ball milling technique may conduce together to much better intrinsic pinning capabilities in Y-358. The nano-entities induced by the use of appropriate and well-controlled ball milling parameters in Y-358 sample could act as additional and efficient pinning sources resulting in a global improvement of flux pinning properties.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present invention is intended to be illustrative, but not limiting of the scope of the disclosure, as well as other claims. The disclosure, including any readily discernible variants of the teachings herein, defines, in part, the scope of the foregoing claim terminology such that no inventive subject, matter is dedicated to the public.

The invention claimed is:

1. A method for making a superconducting coil for magnetic resonance imaging, comprising:
    mixing powders of yttrium (III) oxide, barium carbonate, and copper (II) oxide then pelletizing to form a pelletized mixture;
    calcining the pelletized mixture at a first temperature in the range 850-900° C. to form a first calcined mixture;
    grinding the first calcined mixture to form a first intermediate calcined mixture, then
    calcining the first intermediate calcined mixture at a temperature in the range 850-900° C. to form a second calcined mixture, wherein the second calcined mixture is free from carbonate;
    ball milling the second calcined mixture at a ball to powder ratio of 5:2 to produce a ball milled sample;
    sintering the ball milled sample at a second temperature in the range 900-1,000° C. to form a polycrystalline $Y_3Ba_5Cu_8O_y$ material;
    forming a superconductor wire or tape from the polycrystalline $Y_3Ba_5Cu_8O_y$ material; and
    forming the superconducting coil from the superconductor wire or tape;
    wherein the polycrystalline $Y_3Ba_5Cu_8O_y$ material is in the form of elongated crystals having an average length of 2 to 10 μm and an average width of 1 to 2 μm, and are embedded with spherical nanoparticles of yttrium deficient $Y_3Ba_5Cu_8O_y$ having an average diameter of 5 to 20 nm, wherein the spherical nanoparticles are in the form of flower-like agglomerates having an average particle size of 30 to 60 nm.

2. The method of claim 1, wherein the second calcined mixture is ball milled using a planetary ball milling technique for 3 to 5 hours at a rotational speed of 300 to 600 rpm.

3. The method of claim 1, wherein the second calcined mixture is ball milled with stainless-steel balls and vials.

4. The method of claim 1, wherein the second calcined mixture is ball milled noncontinuously in increments of 20 to 30 minutes separated by cooling off periods of 5 to 10 min.

5. The method of claim 1, wherein the ball milled sample is pelletized under a uniaxial pressure of about 750 MPa.

6. The method of claim 1, wherein the ball milled sample is sintered in an oxygen atmosphere at 950° C. for up to 72 hours.

7. The method of claim 1, wherein the polycrystalline $Y_3Ba_5Cu_8O_y$ material has a normalized transport critical current density, JctN, of 0.040 to 0.042 under an applied transverse magnetic field ($\mu_0H$) of 100 mT.

8. The method of claim 1, wherein the polycrystalline $Y_3Ba_5Cu_8O_y$ material has a magnetization critical current density $J_{cm}$ of $13\times10^3$ to $15\times10^3$ $A\cdot cm^{-2}$ and 550 to 570 $A\cdot cm^{-2}$ at 0 Tesla and 1 Tesla, respectively.

9. The method of claim 1, wherein the polycrystalline $Y_3Ba_5Cu_8O_y$ material has a lower critical magnetic field ($B_{c1}(0)$) of 7 to 7.25 Tesla and an upper critical magnetic field ($B_{c2}(0)$) of 580 to 585 Tesla.

10. The method of claim 1, wherein the polycrystalline $Y_3Ba_5Cu_8O_y$ material has an estimated critical current density at temperature T=0K $J_c(0)$) of $320\times10^3$ to $330\times10^3$ $A\cdot cm^{-2}$.

\* \* \* \* \*